(12) United States Patent
Fu et al.

(10) Patent No.: US 12,644,942 B2
(45) Date of Patent: Jun. 2, 2026

(54) ITERATIVE SHIMMING FOR LOW-FIELD HEAD-OPTIMIZED MRI

(71) Applicant: neuro42, Inc., San Francisco, CA (US)

(72) Inventors: Guanhao Fu, Richmond, CA (US); Nio Anderson, San Francisco, CA (US); Rishabh Ostawal, San Francisco, CA (US); Haidong Peng, San Francisco, CA (US); Hung-Yu Lin, Walnut Creek, CA (US)

(73) Assignee: neuro42, Inc., San Francisco, CA (US)

( * ) Notice: Subject to any disclaimer, the term of this patent is extended or adjusted under 35 U.S.C. 154(b) by 5 days.

(21) Appl. No.: 18/450,010

(22) Filed: Aug. 15, 2023

(65) Prior Publication Data

US 2025/0060440 A1 Feb. 20, 2025

(51) Int. Cl.
*G01R 33/54* (2006.01)
*G01R 33/38* (2006.01)
(Continued)

(52) U.S. Cl.
CPC ....... *G01R 33/543* (2013.01); *G01R 33/3806* (2013.01); *G01R 33/383* (2013.01); *G01R 33/3873* (2013.01)

(58) Field of Classification Search
None
See application file for complete search history.

(56) References Cited

U.S. PATENT DOCUMENTS

| | | | | |
|---|---|---|---|---|
| 9,285,441 B1 * | 3/2016 | McDowell | ....... | G01R 33/34046 |
| 2011/0057655 A1 * | 3/2011 | Ando | ................ | G01R 33/3873 |
| | | | | 324/318 |

(Continued)

FOREIGN PATENT DOCUMENTS

| | | | | | |
|---|---|---|---|---|---|
| EP | | 3985409 A1 * | 4/2022 | ......... | G01R 33/0023 |
| WO | WO-2022236308 A1 | 11/2022 | | | |
| WO | WO-2025038885 A3 | 4/2025 | | | |

OTHER PUBLICATIONS

O'Reilly et al., Three-dimensional MRI in a homogenous 27 cm diameter bore Halbach array magnet, Journal of Magnetic Resonance 307 (2019), p. 1-9.

(Continued)

*Primary Examiner* — Rodney E Fuller
(74) *Attorney, Agent, or Firm* — Wilson Sonsini Goodrich & Rosati

(57) ABSTRACT

The present disclosure provides various devices, systems, and methods for iterative shimming in magnetic resonance imaging (MRI). In one aspect, a method of iterative shimming can include generating a field map of a magnetic field $B_0$ from an MRI system. The MRI system can include a shim tray and an array of permanent magnets to generate the magnetic field $B_0$. The shim tray can include slots to receive shim magnets. The method can further include shimming the MRI system by iteratively: applying the field map to a genetic algorithm to determine a set of slots to receive a set of shim magnets, installing the set of shim magnets in the set of slots, generating a next field map of the magnetic field $B_0$, and either performing a next iteration based on the next field map or determining to not perform the next iteration based on the next field map.

20 Claims, 17 Drawing Sheets

(51) Int. Cl.
G01R 33/383 (2006.01)
G01R 33/3873 (2006.01)

(56) References Cited

U.S. PATENT DOCUMENTS

| | | | | |
|---|---|---|---|---|
| 2017/0276749 | A1* | 9/2017 | Hugon | ............... G01R 33/3873 |
| 2018/0313920 | A1 | 11/2018 | Sotgiu | |
| 2020/0305758 | A1* | 10/2020 | McDaniel | ............ G01R 33/383 |
| 2022/0354378 | A1 | 11/2022 | Nacev et al. | |
| 2023/0085309 | A1* | 3/2023 | Punzo | ................. G01R 33/383 |
| | | | | 324/309 |
| 2024/0168105 | A1 | 5/2024 | Inglis et al. | |
| 2024/0215849 | A1 | 7/2024 | Lin et al. | |
| 2024/0215927 | A1 | 7/2024 | Lin | |
| 2024/0219504 | A1 | 7/2024 | Lin et al. | |
| 2024/0230804 | A1 | 7/2024 | Zou | |
| 2024/0230811 | A1 | 7/2024 | Peng | |

OTHER PUBLICATIONS

McDaniel, Computational Design and Fabrication of Portable MRI Systems, Massachusetts Institute of Technology, (Sep. 2020), p. 1-212.

Cooley et al., Design of Sparse Halbach Magnet Arrays for Portable MRI Using a Genetic Algorithm, IEEE Transactions on Magnetics (Jan. 1, 2018), 54(1):1-12.

Wenzel et al., B0-Shimming Methodology for Affordable and Compact Low-Field Magnetic Resonance Imaging Magnets, frontiers in Physics (Jul. 2021), 9:1-12.

Cooley et al., A portable scanner for magnetic resonance imaging of the brain, Nature Biomedical Engineering (Mar. 2021), 5:229-239.

IEEE Standard for Information technology—Telecommunications and information exchange between systems—Local and metropolitan area networks—Specific requirements Part 3: Carrier Sense Multiple Access with Collision Detection (CSMA/CD) Access Method and Physical Layer Specifications. IEEE Standard 802.3:1-2977 (2008).

PCT/US2024/042565 International Search Report and Written Opinion dated Oct. 21, 2024.

The ATM Forum Technical Committee. ATM-MPLS Network Interworking Version 2.0, Aug. 2003; [retrieved on Aug. 20, 2024]. Available at URL:https://www.broadband-forum.org/download/af-aic-0178.001.pdf pp. 1-34.

* cited by examiner

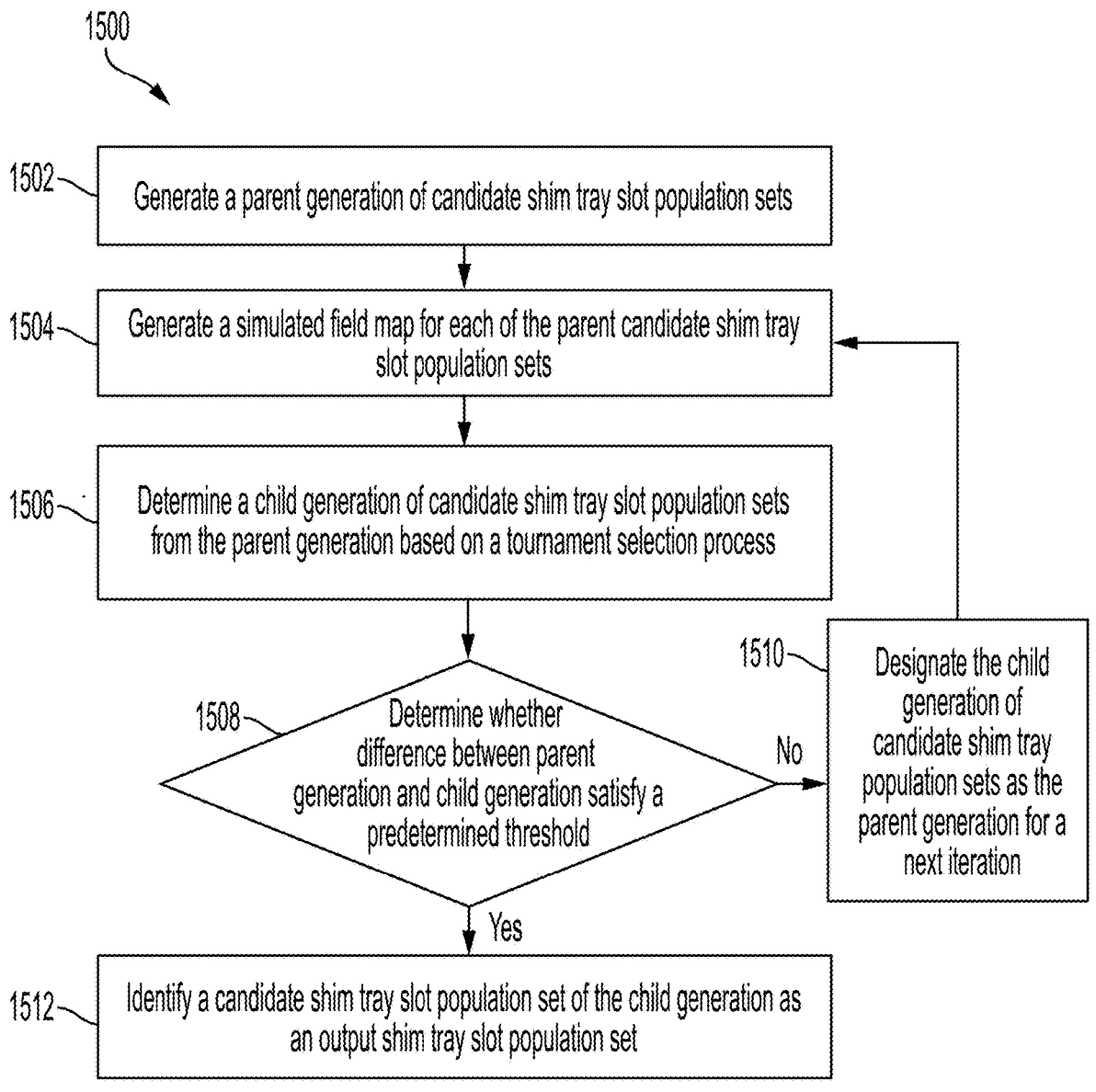

1500

1502 — Generate a parent generation of candidate shim tray slot population sets

1504 — Generate a simulated field map for each of the parent candidate shim tray slot population sets 1506 — Determine a child generation of candidate shim tray slot population sets from the parent generation based on a tournament selection process 1508 — Determine whether difference between parent generation and child generation satisfy a predetermined threshold No 1510 — Designate the child generation of candidate shim tray population sets as the parent generation for a next iteration Yes 1512 — Identify a candidate shim tray slot population set of the child generation as an output shim tray slot population set

FIG. 15

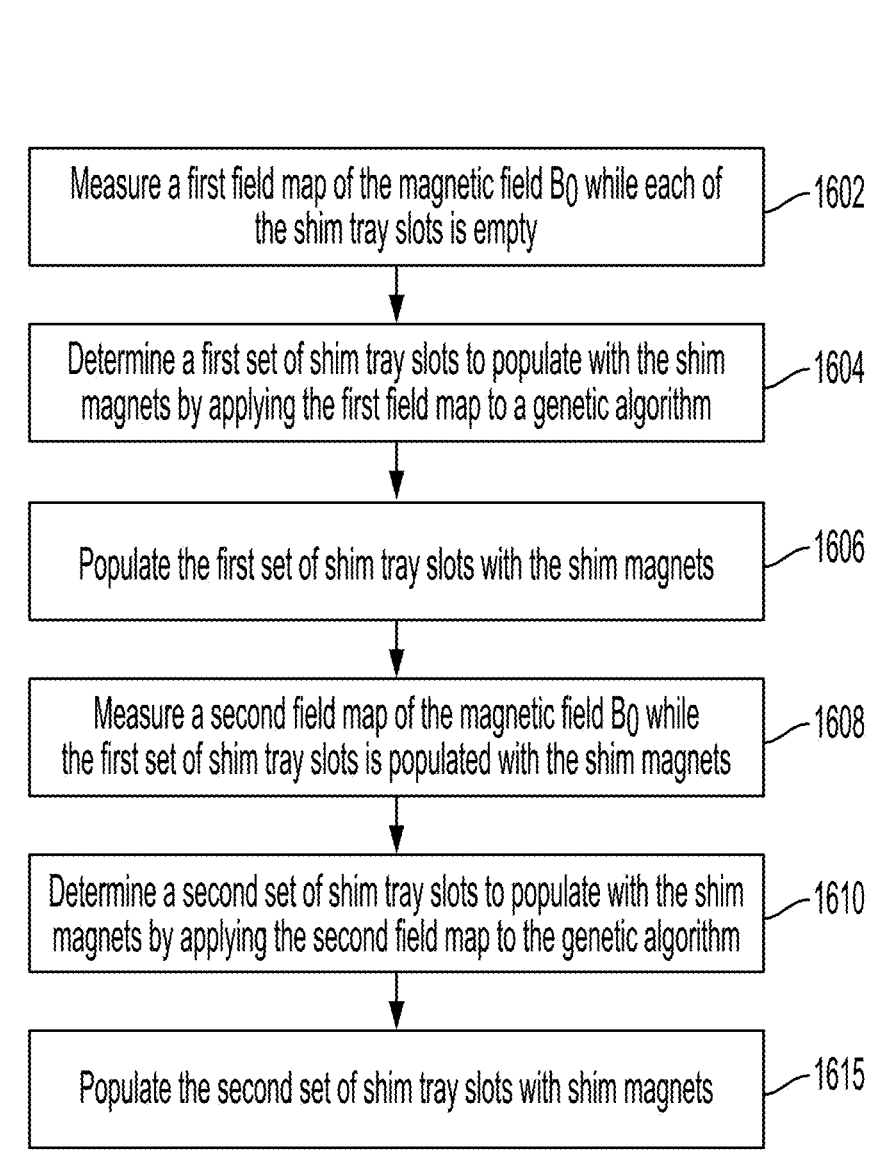

1600

Measure a first field map of the magnetic field $B_0$ while each of the shim tray slots is empty — 1602

Determine a first set of shim tray slots to populate with the shim magnets by applying the first field map to a genetic algorithm — 1604

Populate the first set of shim tray slots with the shim magnets — 1606

Measure a second field map of the magnetic field $B_0$ while the first set of shim tray slots is populated with the shim magnets — 1608

Determine a second set of shim tray slots to populate with the shim magnets by applying the second field map to the genetic algorithm — 1610

Populate the second set of shim tray slots with shim magnets — 1615

FIG. 16

ITERATIVE SHIMMING FOR LOW-FIELD HEAD-OPTIMIZED MRI

BACKGROUND

The present disclosure relates to magnetic resonance imaging (MRI), medical imaging, medical intervention, and surgical intervention. MRI systems often include large and complex machines that generate significantly high magnetic fields and create significant constraints on the feasibility of certain surgical interventions. Restrictions can include limited physical access to the patient by a surgeon and/or a surgical robot and/or limitations on the usage of certain electrical and mechanical components in the vicinity of the MRI scanner. Such limitations are inherent in the underlying design of many existing systems and are difficult to overcome.

SUMMARY

According to one aspect, the present disclosure provides a method. The method includes generating a first field map of a magnetic field $B_0$ from a magnetic resonance imaging (MRI) system. The MRI system can include an array of permanent magnets in a modified Halbach dome arrangement and a shim tray. The array can include one open end sized to receive a head of a patient and can be configured to generate the magnetic field $B_0$. The shim tray can include slots configured to receive shim magnets. The first field map corresponds to a magnetic field based on each of the slots being empty. The method further includes applying the first field map to a genetic algorithm to determine a first set of slots to receive a first set of shim magnets and installing the first set of shim magnets in the first set of slots. The method further includes generating a second field map of the magnetic field $B_0$. The second field map can correspond to a magnetic field based on the first set of shim magnets being installed in the first set of slots. The method further includes applying the second field map to the genetic algorithm to determine a second set of slots to receive a second set of shim magnets and installing the second set of shim magnets in the second set of slots. The second set of slots is different than the first set of slots.

According to another aspect, the present disclosure provides a system for magnetic resonance imaging (MRI). The system includes an array of permanent magnets and a shim tray. The array of permanent magnets is in a modified Halbach arrangement forming one open end. The open end can be sized to receive a head of a patient. The array of permanent magnets can be configured to generate a low-field strength magnetic field $B_0$ toward an object of interest located within a field of view. The shim tray is positionable within the array of permanent magnets and includes an array of shim tray slots. The shim tray can include an opening sized to receive the head of the patient. Each of the shim tray slots can be configured to receive a shim magnet in a first configuration and a second configuration. In the first configuration, a polarity of the shim magnet can be oriented in a first direction. In the second configuration, the polarity of the shim magnet can be oriented in a second direction that is opposite the first direction.

According to yet another aspect, the present disclosure provides a method. The method includes generating a field map of a magnetic field $B_0$ from a magnetic resonance imaging (MRI) system. The MRI system can include an array of permanent magnets in a modified Halbach dome arrangement and a shim tray. The array can include one open end sized to receive a head of a patient and can be configured to generate the magnetic field $B_0$. The shim tray can include slots configured to receive shim magnets. The method further includes shimming the MRI system by iteratively: applying the field map to a genetic algorithm to determine a set of slots to receive a set of shim magnets, installing the set of shim magnets in the set of slots, generating a next field map of the magnetic field $B_0$, and either performing a next iteration based on the next field map or determining to not perform the next iteration based on the next field map.

BRIEF DESCRIPTION OF THE DRAWINGS

The various aspects described herein, both as to organization and methods of operation, together with further objects and advantages thereof, may best be understood by reference to the following description, taken in conjunction with the accompanying drawings as follows.

FIG. 13 depicts an example panel of the shim tray FIG. 9, in accordance with at least one aspect of the present disclosure.

FIG. 15 depicts a flow chart of a genetic algorithm, in accordance with at least one aspect of the present disclosure.

FIG. 16 depicts a flow chart of a method of passive shimming for an MRI system, in accordance with at least one aspect of the present disclosure.

Corresponding reference characters indicate corresponding parts throughout the several views. The exemplifications set out herein illustrate various disclosed embodiments, is one form, and such exemplifications are not to be construed as limiting the scope thereof in any manner.

DETAILED DESCRIPTION

Figure 1:
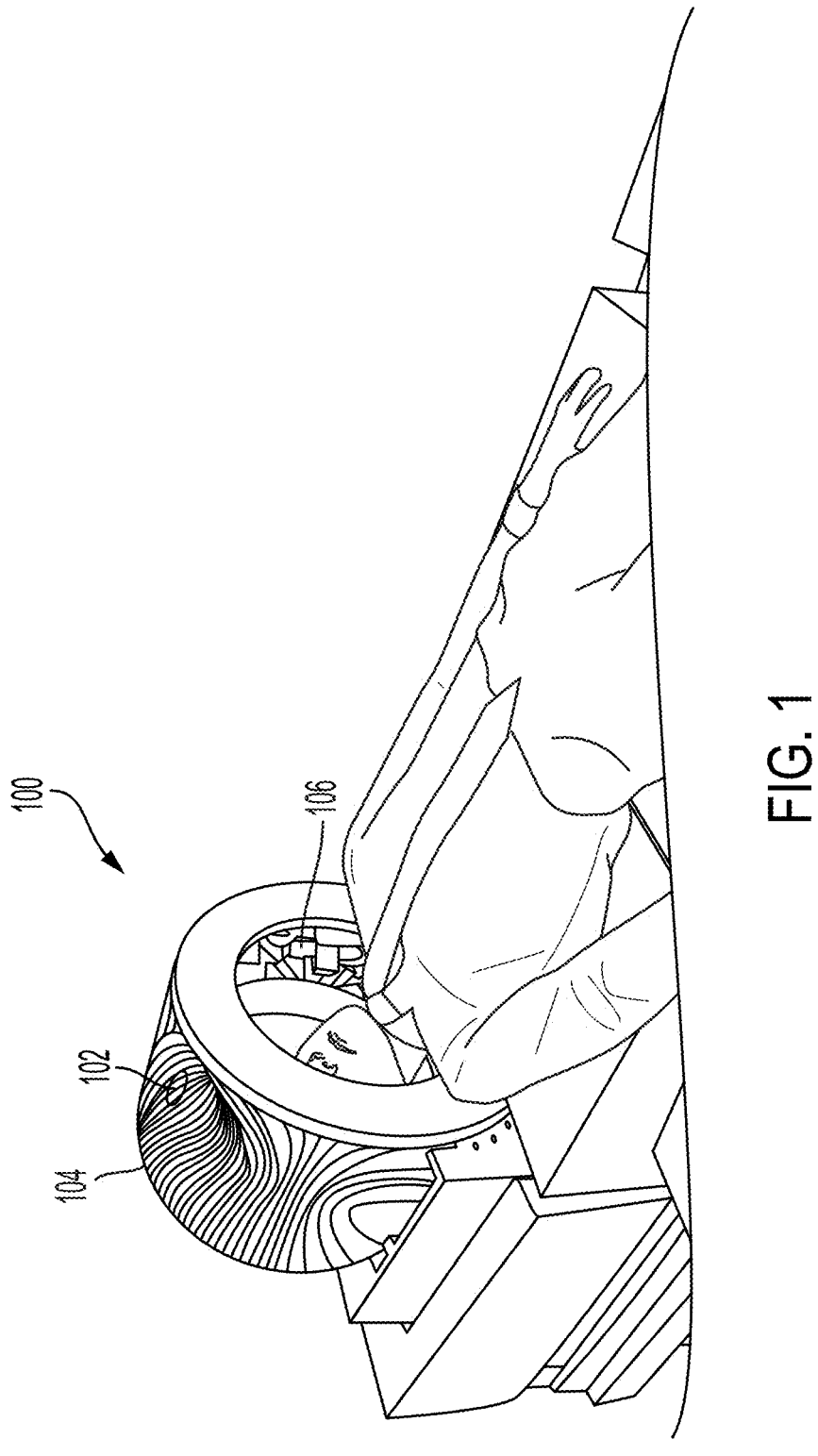
FIG. 1 depicts components of a MRI scanning system including a dome-shaped housing for a magnetic array, the dome-shaped housing surrounding a region of interest therein and further depicting the dome-shaped housing positioned to receive at least a portion of the head of a patient reclined on the table into the region of interest, in accordance with at least one aspect of the present disclosure.

Applicant of the present application also owns the following patent applications, which are each herein incorporated by reference in their respective entireties:

International Patent Application No. PCT/US2022/72143, titled NEURAL INTERVENTIONAL MAGNETIC RESONANCE IMAGING APPARATUS, filed May 5, 2022;

U.S. patent application Ser. No. 18/057,207, titled SYSTEM AND METHOD FOR REMOVING ELECTROMAGNETIC INTERFERENCE FROM LOW-FIELD MAGNETIC RESONANCE IMAGES, filed Nov. 19, 2022;

U.S. patent application Ser. No. 18/147,418, titled MODULARIZED MULTI-PURPOSE MAGNETIC RESONANCE PHANTOM, filed Dec. 28, 2022;

U.S. patent application Ser. No. 18/147,542, titled INTRACRANIAL RADIO FREQUENCY COIL FOR INTRAOPERATIVE MAGNETIC RESONANCE IMAGING, filed Dec. 28, 2022;

U.S. patent application Ser. No. 18/147,556, titled DEEP LEARNING SUPER-RESOLUTION TRAINING FOR ULTRA LOW-FIELD MAGNETIC RESONANCE IMAGING, filed Dec. 28, 2022; and U.S. patent application Ser. No. 18/153,111, titled ACCELERATING MAGNETIC RESONANCE IMAGING USING PARALLEL IMAGING AND ITERATIVE IMAGE RECONSTRUCTION, filed Jan. 11, 2023; and U.S. patent application Ser. No. 18/153,175, titled FAST T2-WEIGHTED AND DIFFUSION-WEIGHTED CHIRPED-CPMG SEQUENCES, filed Jan. 11, 2023; and U.S. Provisional Patent Application No. 63/488,102, titled A METHOD OF MERGING A CO-OPERATIVE MR-COMPATIBLE ROBOT AND A LOW-FIELD PORTABLE MRI SYSTEM, filed Mar. 2, 2023.

Before explaining various aspects of interventional magnetic resonance imaging devices in detail, it should be noted that the illustrative examples are not limited in application or use to the details of construction and arrangement of parts illustrated in the accompanying drawings and description. The illustrative examples may be implemented or incorporated in other aspects, variations and modifications, and may be practiced or carried out in various ways. Further, unless otherwise indicated, the terms and expressions employed herein have been chosen for the purpose of describing the illustrative examples for the convenience of the reader and are not for the purpose of limitation thereof. Also, it will be appreciated that one or more of the following-described aspects, expressions of aspects, and/or examples, can be combined with any one or more of the other following-described aspects, expressions of aspects and/or examples.

Various aspects are directed to neural interventional magnetic resonance imaging (MRI) devices that allows for the integration of surgical intervention and guidance with an MRI. This includes granting physical access to the area around the patient as well as access to the patient's head with one or more access apertures. In addition, the neural interventional MRI device may allow for the usage of robotic guidance tools and/or traditional surgical implements. In various instances, a neural interventional MRI can be used intraoperatively to obtain scans of a patient's head and/or brain during a surgical intervention, such as a surgical procedure like a brain biopsy or neurosurgery.

FIG. 1 depicts a MRI scanning system 100 that includes a dome-shaped housing 102 configured to receive a patient's head. The dome-shaped housing 102 can further include at least one access aperture configured to allow access to the patient's head to enable a neural intervention. A space within the dome-shaped housing 102 forms the region of interest for the MRI scanning system 100. Target tissue in the region of interest is subjected to magnetization fields/pulses, as further described herein, to obtain imaging data representative of the target tissue.

For example, a patient can be positioned such that his/her head is positioned within the region of interest within the dome-shaped housing 102. The brain can be positioned entirely within the dome-shaped housing 102. In such instances, to facilitate intracranial interventions (e.g. neurosurgery) in concert with MR imaging, the dome-shaped housing 102 can include one or more apertures that provide access to the brain. Apertures can be spaced apart around the perimeter of the dome-shaped housing.

The MRI scanning system 100 can include an auxiliary cart (see, e.g. auxiliary cart 540 in FIG. 6) that houses certain conventional MRI electrical and electronic components, such as a computer, programmable logic controller, power distribution unit, and amplifiers, for example. The MRI scanning system 100 can also include a magnet cart that holds the dome-shaped housing 102, gradient coil(s), and/or a transmission coil, as further described herein.

Additionally, the magnet cart can be attached to a receive coil in various instances. Referring primarily to FIG. 1, the dome-shaped housing 102 can further include RF transmission coils, gradient coils 104 (depicted on the exterior thereof), and shim magnets 106 (depicted on the interior thereof). Alternative configurations for the gradient coil(s) 104 and/or shim magnets 106 are also contemplated. In various instances, the shim magnets 106 can be adjustably positioned in a shim tray within the dome-shaped housing 102, which can allow a technician to granularly configure the magnetic flux density of the dome-shaped housing 102.

Various structural housings for receiving the patient's head and enabling neural interventions can be utilized with a MRI scanning system, such as the MRI scanning system 100. In one aspect, the MRI scanning system 100 may be outfitted with an alternative housing, such as a dome-shaped housing 202 (FIG. 2) or a two-part housing 302 (FIG. 3) configured to form a dome-shape. The dome-shaped housing 202 defines a plurality of access apertures 203; the two-part housing 302 also defines a plurality of access apertures 303 and further includes an adjustable gap 305 between the two parts of the housing.

Figures 2, 3:
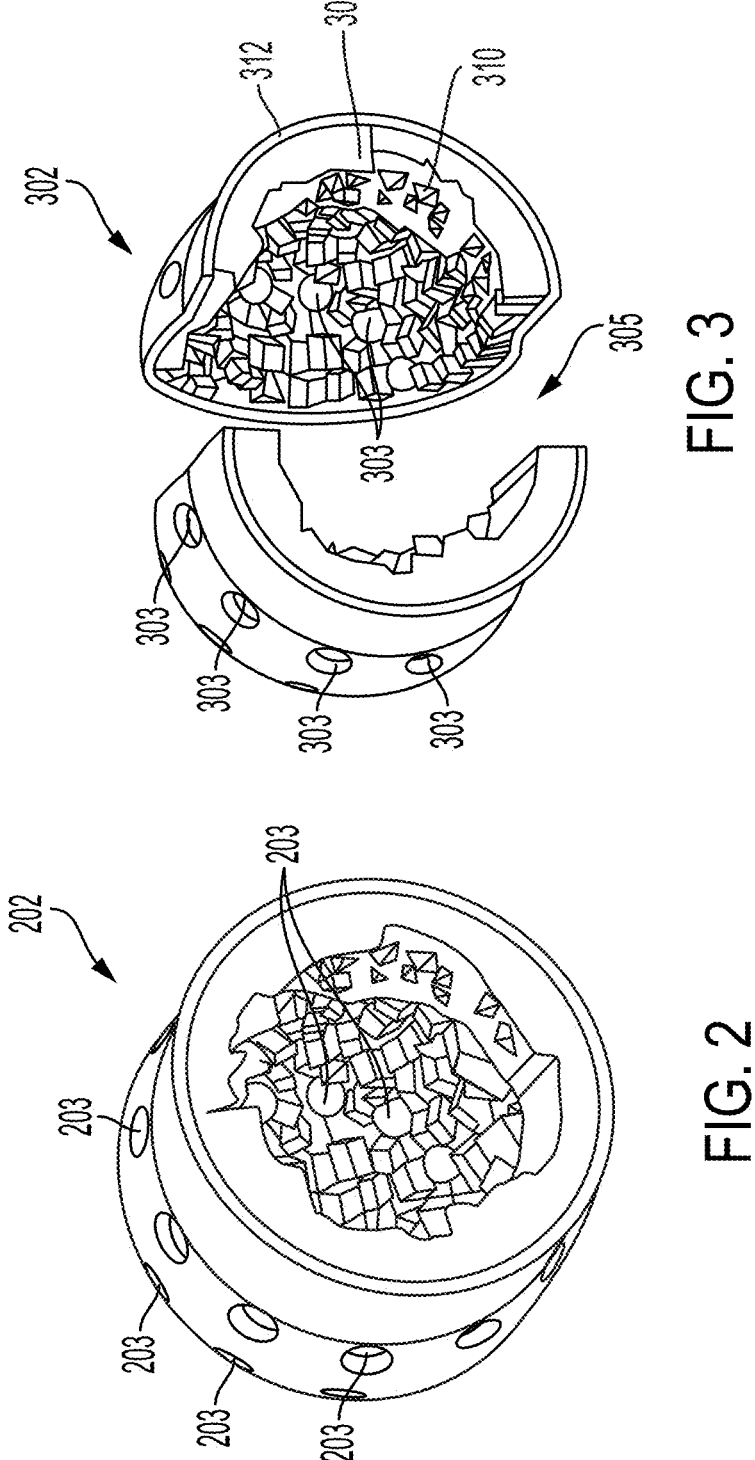
FIG. 2 is a perspective view of an alternative dome-shaped housing for a magnetic array for use with the MRI scanning system of FIG. 1, wherein access apertures are defined in the dome-shaped housing, in accordance with at least one aspect of the present disclosure.
FIG. 3 is a perspective view of an alternative dome-shaped housing for a magnetic array for use with the MRI scanning system of FIG. 1, wherein access apertures and an adjustable gap is defined in the dome-shaped housing, in accordance with at least one aspect of the present disclosure.

In various instances, the housings 202 and 302 can include a bonding agent 308, such as an epoxy resin, for example, that holds a plurality of magnetic elements 310 in fixed positions. The plurality of magnetic elements 310 can be bonded to a structural housing 312, such as a plastic substrate, for example. In various aspects, the bonding agent 308 and structural housing 312 may be non-conductive or diamagnetic materials. Referring primarily to FIG. 3, the two-part housing 302 comprises two structural housings 312. In various aspect, a structural housing for receiving the patient's head can be formed from more than two sub-parts.

The access apertures 303 in the structural housing 312 provide a passage directly to the patient's head and are not obstructed by the structural housing 312, bonding agent 308, or magnetic elements 310. The access apertures 303 can be positioned in an open space of the housing 302, for example.

There are many possible configurations of neural interventional MRI devices that can achieve improved access for surgical intervention. Many configurations build upon two main designs, commonly known as the Halbach cylinder and the Halbach dome described in the following article: Cooley et al. (e.g. Cooley, C. Z., Haskell, M. W., Cauley, S. F., Sappo, C., Lapierre, C. D., Ha, C. G., Stockmann, J. P., & Wald, L. L. (2018). Design of sparse Halbach magnet arrays for portable MRI using a genetic algorithm. IEEE transactions on magnetics, 54(1), 5100112. The article "Design of sparse Halbach magnet arrays for portable MRI using a genetic algorithm" by Cooley et al., published in IEEE transactions on magnetics, 54(1), 5100112 in 2018, is incorporated by reference herein in its entirety.

In various instances, a dome-shaped housing for an MRI scanning system, such as the system 100, for example, can include a Halbach dome defining a dome shape and configured based on several factors including main magnetic field $B_0$ strength, field size, field homogeneity, device size, device weight, and access to the patient for neural intervention. In various aspects, the Halbach dome comprises an exterior radius and interior radius at the base of the dome. The Halbach dome may comprise an elongated cylindrical portion that extends from the base of the dome. In one aspect, the elongated cylindrical portion comprises the same exterior radius and interior radius as the base of the dome and continues from the base of the dome at a predetermined length, at a constant radius. In another aspect, the elongated cylindrical portion comprises a different exterior radius and interior radius than the base of the dome (see e.g. FIGS. 2 and 3). In such instances, the different exterior radius and interior radius of the elongated cylindrical portion can merge with the base radii in a transitional region.

Figure 4:
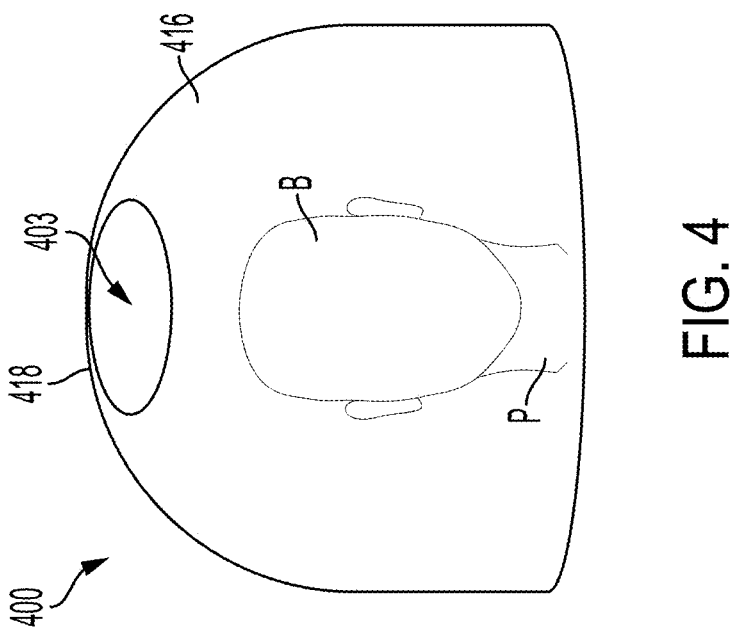
FIG. 4 depicts a dome-shaped housing for use with a MRI scanning system having an access aperture in the form of a centrally-defined hole, in accordance with at least one aspect of the present disclosure.

FIG. 4 illustrates an exemplary Halbach dome 400 for an MRI scanning system, such as the system 100, for example, which defines an access aperture in the form of a hole or access aperture 403, where the dome 400 is configured to receive a head and brain B of the patient P within the region of interest therein, and the access aperture 403 is configured to allow access to the patient P to enable neural intervention with a medical instrument and/or robotically-controlled surgical tool, in accordance with at least one aspect of the present disclosure. The Halbach dome 400 can be built with a single access aperture 403 at the top side 418 of the dome 400, which allows for access to the top of the skull while minimizing the impact to the magnetic field. Additionally or alternatively, the dome 300 can be configured with multiple access apertures around the structure 416 of the dome 400, as shown in FIGS. 2 and 3.

The diameter $D_{hole}$ of the access aperture 403 may be small (e.g. about 2.54 cm) or very large (substantially the exterior $r_{ext}$ diameter of the dome 400). As the access aperture 403 becomes larger, the dome 400 begins to resemble a Halbach cylinder, for example. The access aperture 403 is not limited to being at the apex of the dome 400. The access aperture 403 can be placed anywhere on the surface or structure 416 of the dome 400. In various instances, the entire dome 400 can be rotated so that the access aperture 403 can be co-located with a desired physical location on the patient P.

Figure 5:
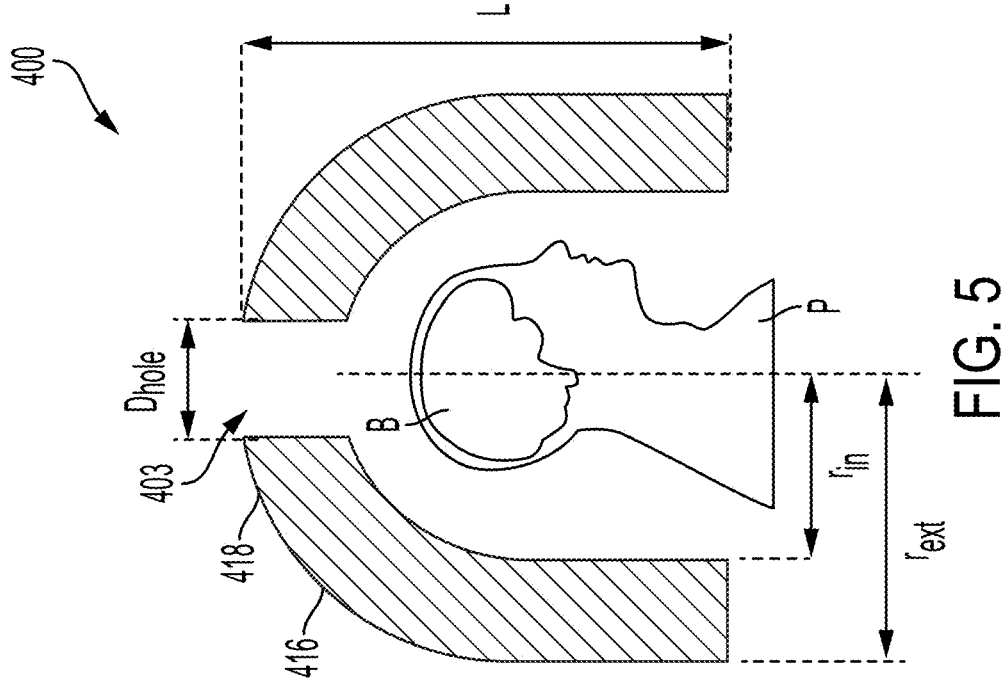
FIG. 5 is a cross-sectional view of the dome-shaped housing of FIG. 4, in accordance with at least one aspect of the present disclosure.

FIG. 5 depicts relative dimensions of the Halbach dome 400, including a diameter $D_{hole}$ of the access aperture 403, a length L of the dome 400, and an exterior radius $r_{ext}$ and an interior radius $r_{in}$ of the dome 400. The Halbach dome 400 comprises a plurality of magnetic elements that are configured in a Halbach array and make up a magnetic assembly. The plurality of magnetic elements may be enclosed by the exterior radius $r_{ext}$ and interior radius $r_{in}$ in the structure 416 or housing thereof. In one aspect, example dimensions may be defined as: $r_{in}$=19.3 cm; $r_{ext}$=23.6 cm; L=38.7 cm; and 2.54 cm≤D≤19.3 cm.

Based on the above example dimensions, a Halbach dome 400 with an access aperture 403 may be configured with a magnetic flux density $B_0$ of around 72 mT, and an overall mass of around 35 kg. It will be appreciated that the dimensions may be selected based on particular applications to achieve a desired magnetic flux density $B_0$, total weight of the Halbach dome 400 and/or magnet cart, and geometry of the neural intervention access aperture 403.

In various aspects, the Halbach dome 400 may be configured to define multiple access apertures 403 placed around the structure 416 of the dome 400. These multiple access apertures 403 may be configured to allow for access to the patient's head and brain B using tools (e.g., surgical tools) and/or a surgical robot.

In various aspects, the access aperture 403 may be adjustable. The adjustable configuration may provide the ability for the access aperture 403 to be adjusted using either a motor, mechanical assist, or a hand powered system with a mechanical iris configuration, for example, to adjust the diameter $D_{hole}$ of the access aperture 403. This would allow for configuration of the dome without an access aperture 403, conducting an imaging scan, and then adjusting the configuration of the dome 400 and mechanical iris thereof to include the access aperture 403 and, thus, to enable a surgical intervention therethrough.

Halbach domes and magnetic arrays thereof for facilitating neural interventions are further described in International Patent Application No. PCT/US2022/72143, titled NEURAL INTERVENTIONAL MAGNETIC RESO- NANCE IMAGING APPARATUS, filed May 5, 2022, which is incorporated by reference herein in its entirety.

Figure 6:
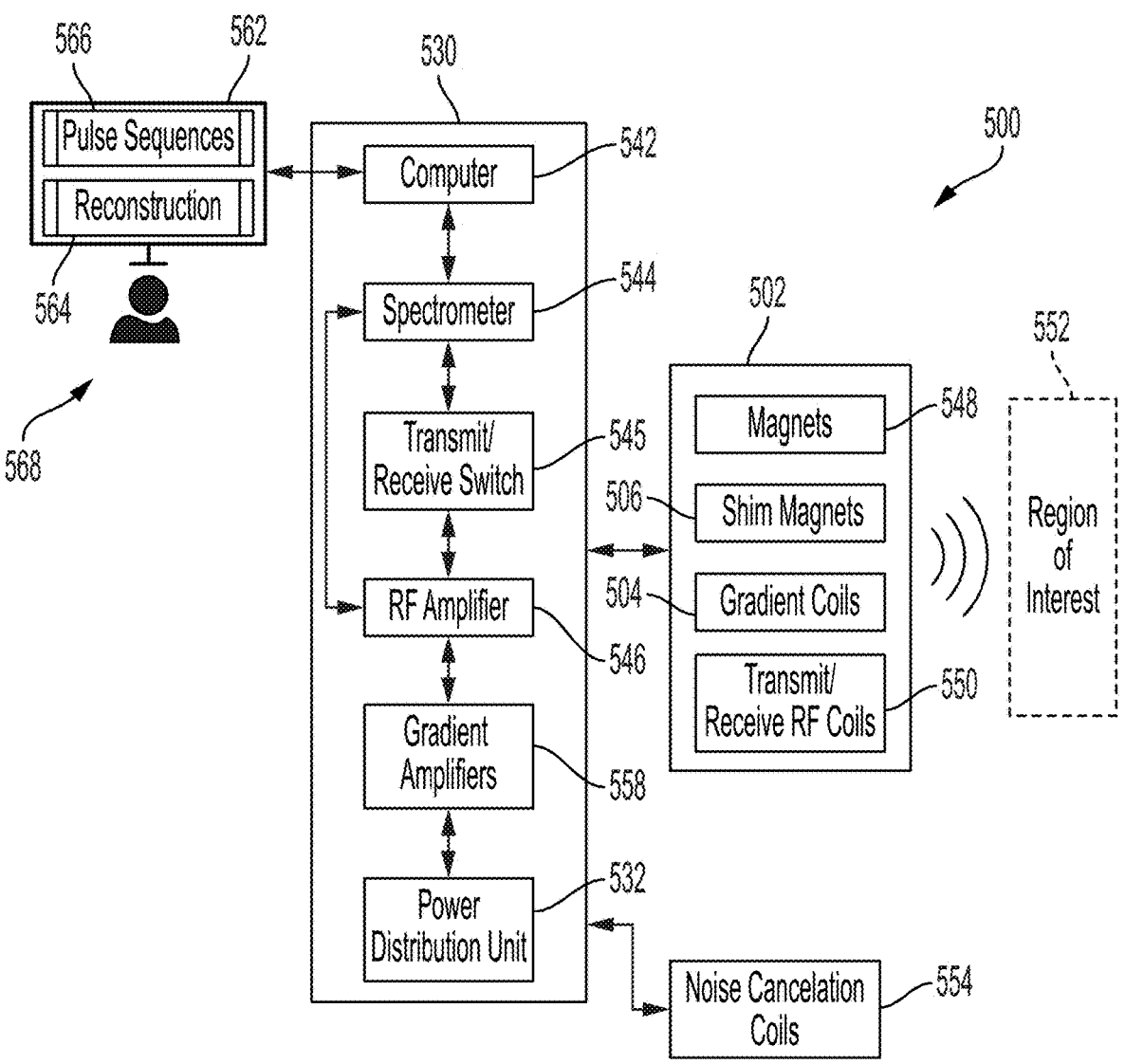
FIG. 6 depicts a control schematic for a MRI system, in accordance with at least one aspect of the present disclosure.

Referring now to FIG. 6, a schematic for an MRI system 500 is shown. The MRI scanning system 100 (FIG. 1) and the various dome-shaped housings and magnetic arrays therefor, which are further described herein, for example, can be incorporated into the MRI system 500, for example. The MRI system 500 includes a housing 502, which can be similar in many aspects to the dome-shaped housings 102 (FIG. 1), 202 (FIG. 2), and/or 302 (FIG. 3), for example. The housing 502 is dome-shaped and configured to form a region of interest, or field of view, 552 therein. For example, the housing 502 can be configured to receive a patient's head in various aspects of the present disclosure.

The housing 502 includes a magnet assembly 548 having a plurality of magnets arranged therein (e.g. a Halbach array of magnets). In various aspect, the main magnetic field $B_0$, generated by the magnetic assembly 548, extends into the field of view 552, which contains an object (e.g. the head of a patient) that is being imaged by the MRI system 500.

The MRI system 500 also includes RF transmit/receive coils 550. The RF transmit/receive coils 550 are combined into integrated transmission-reception (Tx/Rx) coils. In other instances, the RF transmission coil can be separate from the RF reception coil. For example, the RF transmission coil(s) can be incorporated into the housing 502 and the RF reception coil(s) can be positioned within the housing 502 to obtain imaging data.

The housing 502 also includes one or more gradient coils 504, which are configured to generate gradient fields to facilitate imaging of the object in the field of view 552 generated by the magnet assembly 548, e.g., enclosed by the dome-shaped housing and dome-shaped array of magnetic elements therein. Shim trays adapted to receive shim magnets 506 can also be incorporated into the housing 502.

During the imaging process, the main magnetic field $B_0$ extends into the field of view 552. The direction of the effective magnetic field ($B_1$) changes in response to the RF pulses and associated electromagnetic fields transmitted by the RF transmit/receive coils 550. For example, the RF transmit/receive coils 550 may be configured to selectively transmit RF signals or pulses to an object in the field of view 552, e.g. tissue of a patient's brain. These RF pulses may alter the effective magnetic field experienced by the spins in the sample tissue.

The housing 502 is in signal communication with an auxiliary cart 530, which is configured to provide power to the housing 502 and send/receive control signals to/from the housing 502. The auxiliary cart 530 includes a power distribution unit 532, a computer 542, a spectrometer 544, a transmit/receive switch 545, an RF amplifier 546, and gradient amplifiers 558. In various instances, the housing 502 can be in signal communication with multiple auxiliary carts and each cart can support one or more of the power distribution unit 532, the computer 542, the spectrometer 544, the transmit/receive switch 545, the RF amplifier 546, and/or the gradient amplifiers 558.

The computer 542 is in signal communication with a spectrometer 544 and is configured to send and receive signals between the computer 542 and the spectrometer 544. When the object in the field of view 552 is excited with RF pulses from the RF transmit/receive coils 550, the precession of the object results in an induced electric current, or MR current, which is detected by the RF transmit/receive coils 550 and sent to the RF preamplifier 556. The RF preamplifier 556 is configured to boost or amplify the excitation data signals and send them to the spectrometer 544. The spectrometer 544 is configured to send the excitation data to the computer 542 for storage, analysis, and image construction. The computer 542 is configured to combine multiple stored excitation data signals to create an image, for example. In various instances, the computer 542 is in signal communication with at least one database 562 that stores reconstruction algorithms 564 and/or pulse sequences 566. The computer 542 is configured to utilize the reconstruction algorithms to generate an MR image 568.

From the spectrometer 544, signals can also be relayed to the RF transmit/receive coils 550 in the housing 502 via an RF power amplifier 546 and the transmit/receive switch 545 positioned between the spectrometer 544 and the RF power amplifier 546. From the spectrometer 544, signals can also be relayed to the gradient coils 560 in the housing 502 via a gradient power amplifier 558. For example, the RF power amplifier 546 is configured to amplify the signal and send it to RF transmission coils 560, and the gradient power amplifier 558 is configured to amplify the gradient coil signal and send it to the gradient coils 560.

In various instances, the MRI system 500 can include noise cancellation coils 554. For example, the auxiliary cart 530 and/or computer 542 can be in signal communication with noise cancellation coils 554. In other instances, the noise cancellation coils 554 can be optional. For example, certain MRI systems disclosed herein may not include supplemental/auxiliary RF coils for detecting and canceling electromagnetic interference, i.e. noise.

Figure 7:
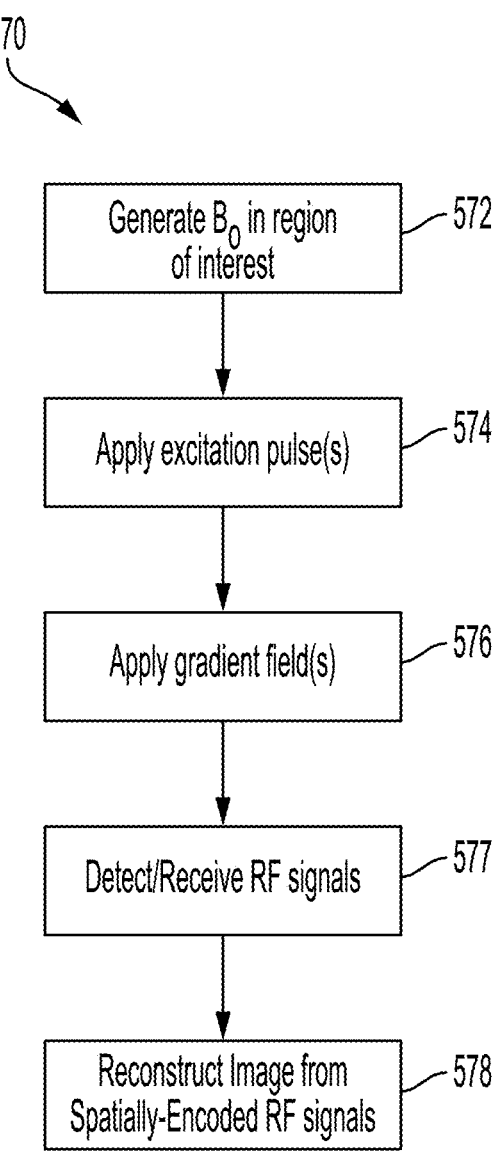
FIG. 7 is a flowchart describing a method for obtaining imaging data from an MRI system, in accordance with at least one aspect of the present disclosure.

A flowchart depicting a process 570 for obtaining an MRI image is shown in FIG. 7. The flowchart can be implemented by the MRI system 500, for example. In various instances, at block 572, the target subject (e.g. a portion of a patient's anatomy), is positioned in a main magnetic field $B_0$ in an interest of region (e.g. region of interest 552), such as within the dome-shaped housing of the various MRI scanners further described herein (e.g. magnet assembly 548). The main magnetic field $B_0$ is configured to magnetically polarize the hydrogen protons (1H-protons) of the target subject (e.g. all organs and tissues) and is known as the net longitudinal magnetization Mo. It is proportional to the proton density (PD) of the tissue and develops exponentially in time with a time constant known as the longitudinal relaxation time T1 of the tissue. T1 values of individual tissues depend on a number of factors including their microscopic structure, on the water and/or lipid content, and the strength of the polarizing magnetic field, for example. For these reasons, the T1 value of a given tissue sample is dependent on age and state of health.

At block 574, a time varying oscillatory magnetic field $B_1$, i.e. an excitation pulse, is applied to the magnetically polarized target subject with a RF coil (e.g. RF transmit/receive coil 550). The carrier frequency of the pulsed $B_1$ field is set to the resonance frequency of the 1H-proton, which causes the longitudinal magnetization to flip away from its equilibrium longitudinal direction resulting in a rotated magnetization vector, which in general can have transverse as well as longitudinal magnetization components, depending on the flip angle used. Common $B_1$ pulses include an inversion pulse, or a 180-degree pulse, and a 90-degree pulse. A 180-degree pulse reverses the direction of the 1H-proton's magnetization in the longitudinal axis. A 90-degree pulse rotates the 1H-proton's magnetization by 90 degrees so that the magnetization is in the transverse plane. The MR signals are proportional to the transverse components of the magnetization and are time varying electrical currents that are detected with suitable RF coils. These MR signals decay exponentially in time with a time constant known as the transverse relaxation time T2, which is also dependent on the microscopic tissue structure, water/lipid content, and the strength of the magnetic field used, for example. At block 576, the MR signals are spatially encoded by exposing the target subject to additional magnetic fields generated by gradient coils (e.g. gradient coils 560), which are known as the gradient fields. The gradient fields, which vary linearly in space, are applied for short periods of time in pulsed form and with spatial variations in each direction. The net result is the generation of a plurality of spatially encoded MR signals, which are detected at block 577, and which can be reconstructed to form MR images depicting slices of the examination subject. A RF reception coil (e.g. RF transmit/receive coil 550) can be configured to detect the spatially-encoded RF signals. Slices may be oriented in the transverse, sagittal, coronal, or any oblique plane.

At block 578, the spatially encoded signals of each slice of the scanned region are digitized and spatially decoded mathematically with a computer reconstruction program (e.g. by computer 542) in order to generate images depicting the internal anatomy of the examination subject. In various instances, the reconstruction program can utilize an (inverse) Fourier transform to back-transforms the spatially-encoded data (k-space data) into geometrically decoded data.

Figure 8:
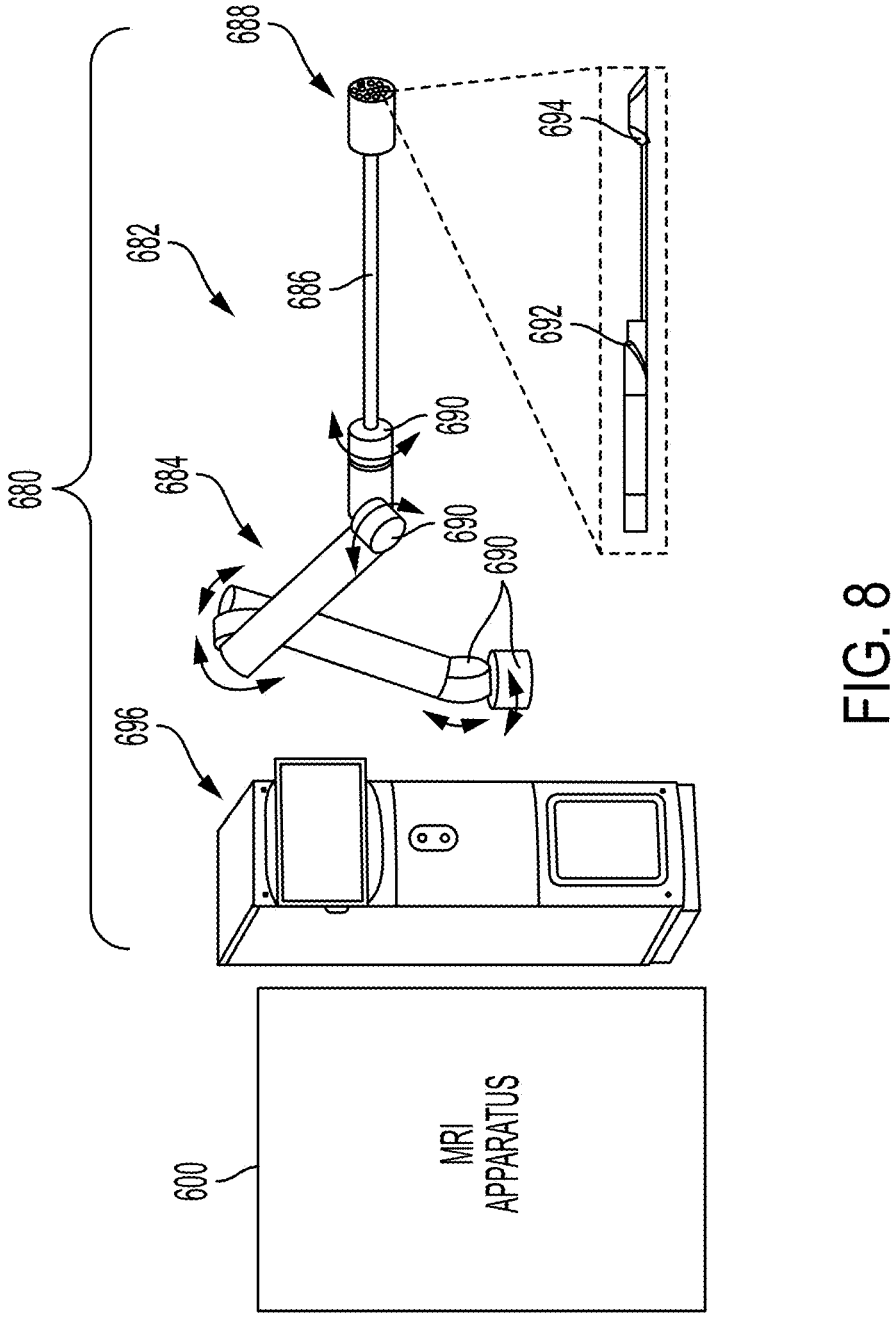
FIG. 8 depicts a MRI scanning system and a robotic system, in accordance with at least one aspect of the present disclosure.

FIG. 8 depicts a graphical illustration of a robotic system 680 that may be used for neural intervention with an MRI scanning system 600. The robotic system 680 includes a computer system 696 and a surgical robot 682. The MRI scanning system 600 can be similar to the MRI system 500 and can include the dome-shaped housing and magnetic arrays having access apertures, as further described herein. For example, the MRI system 500 can include one or more access apertures defined in a Halbach array of magnets in the permanent magnet assembly to provide access to one or more anatomical parts of a patient being imaged during a medical procedure. In various instances, a robotic arm and/or tool of the surgical robot 682 is configured to extend through an access aperture in the permanent magnet assembly to reach a patient or target site. Each access aperture can provide access to the patient and/or surgical site. For example, in instances of multiple access apertures, the multiple access apertures can allow access from different directions and/or proximal locations.

In accordance with various embodiments, the robotic system 680 is configured to be placed outside the MRI system 600. As shown in FIG. 8, the robotic system 680 can include a robotic arm 684 that is configured for movements with one or more degrees of freedom. In accordance with various embodiments, the robotic arm 684 includes one or more mechanical arm portions, including a hollow shaft 686 and an end effector 688. The hollow shaft 686 and end effector 688 are configured to be moved, rotated, and/or swiveled through various ranges of motion via one or more motion controllers 690. The double-headed curved arrows in FIG. 8 signify exemplary rotational motions produced by the motion controllers 690 at the various joints in the robotic arm 684.

In accordance with various embodiments, the robotic arm 684 of the robotic system 682 is configured for accessing various anatomical parts of interest through or around the MRI scanning system 600. In accordance with various embodiments, the access aperture is designed to account for the size of the robotic arm 684. For example, the access aperture defines a circumference that is configured to accommodate the robotic arm 684, the hollow shaft 686, and the end effector 688 therethrough. In various instances, the robotic arm 684 is configured for accessing various anatomical parts of the patient from around a side of the magnetic imaging apparatus 600. The hollow shaft 686 and/or end effector 688 can be adapted to receive a robotic tool 692, such as a biopsy needle having a cutting edge 694 for collecting a biopsy sample from a patient, for example.

The reader will appreciate that the robotic system 682 can be used in combination with various dome-shaped and/or cylindrical magnetic housings further described herein. Moreover, the robotic system 682 and robotic tool 692 in FIG. 8 are exemplary. Alternative robotic systems can be utilized in connection with the various MRI systems disclosed herein. Moreover, handheld surgical instruments and/or additional imaging devices (e.g. an endoscope) and/or systems can also be utilized in connection with the various MRI systems disclosed herein.

In various aspects of the present disclosure, the MRI systems described herein can comprise low field MRI (LF-MRI) systems. In such instances, the main magnetic field $B_0$ generated by the permanent magnet assembly can less than or equal to 1.0 T, such as be between 0.1 T and 1.0 T, for example. In some instances, the MRI systems described herein, such as the LF-MRI systems, can comprise ultra-low field MRI (ULF-MRI) systems. In such instances, the main magnetic field $B_0$ generated by the permanent magnet assembly can be less than or equal to 0.1 T, such as between 0.03 T and 0.1 T, for example.

Various shimming techniques are often employed with MRI systems in order to improve the homogeneity of the main magnetic field $B_0$. Improving the homogeneity of the main magnetic field $B_0$ can result in slower MR signal decay times and ultimately improve overall image quality.

High field MRI (HF-MRI) systems, such as MRI systems employing superconducting magnets capable of generating magnetic fields above 1.0 T, often utilize passive and/or active shimming techniques. Passive shimming generally involves selectively placing ferromagnetic objects within the MRI system scanning bore to modify the main magnetic field $B_0$ for improved field homogeneity. Active shimming generally involves passing a current through a specialized coil of the MRI system to generate a magnetic field that modifies the main magnetic field $B_0$ for improved field homogeneity. For example, many HF-MRI systems include a dedicated set of superconducting shimming coils (e.g., separate from the gradient coils) for active shimming.

LF-MRI systems generally have a higher field inhomogeneity (e.g., sometimes greater than 30,000 ppm) compared to HF-MRI systems. This higher field inhomogeneity can be caused by many reasons. For example, LF-MRI systems typically employ an array of permanent magnets to generate the main magnetic field $B_0$. These permanent magnets generally generate a main magnetic field $B_0$ that is weaker (e.g., less than or equal to 1.0 T, less than or equal to 0.1 T) than the main magnetic field $B_0$ generated by superconducting coils of HF-MRI systems, which can result in increased field inhomogeneity. Furthermore, in the case of LF-MRI systems configured to image the head of a patient, the LF-MRI systems often employ an array of compact permanent magnets arranged in an asymmetric, modified Halbach orientation (e.g., an elongated dome shape) that is closed at one end and open at the opposite end to accommodate the head of the patient. This modified Halbach dome arrangement can result in increased main magnetic field $B_0$ inhomogeneity compared to a magnetic field generated by permanent magnets arranged in a symmetric Halbach cylinder, for example. Yet further, even though a modified Halbach arrangement of magnets may be designed (e.g., based on a computer simulation) to produce a main magnetic field $B_0$ having a given inhomogeneity, the actual inhomogeneity of the main magnetic field $B_0$ is often greater because of manufacturing-related build errors.

Due to various challenges, current LF-MRI systems are often unable to implement the active shimming techniques employed by HF-MRI systems. For example, as mentioned above, HF-MRI systems typically include a dedicated set of shimming coils. Each of the shimming coils in HF-MRI systems can be capable of producing a magnetic field that varies in a uniform and linear manner across a particular region of interest. Accordingly, the effect that shimming coils have on the main magnetic field $B_0$ is relatively predictable for HF-MRI systems. Conversely, LF-MRI systems typically do not have dedicated coils for active shimming. Furthermore, although LF-MRI systems typically do include gradient coils for generating gradient fields during signal acquisition, these gradient fields are much less uniform and vary in a more non-liner manner compared to the fields generated by the superconducting shimming coils of HF-MRI systems. Thus, the effect that the gradient coils have on the main magnetic field $B_0$ in LF-MRI systems can be relatively unpredictable. Accordingly, LF-MRI systems often rely on passive shimming for improving the homogeneity of the main magnetic field $B_0$.

Various passive shimming techniques have been employed in LF-MRI systems, as disclosed in the publication by McDaniel titled "Computational design and fabrication of portable MRI systems," Massachusetts Institute of Technology, Department of Electrical Engineering and Computer Science (2020) and the publication by Wenzel K. et al, titled "$B_0$-Shimming Methodology for Affordable and Compact Low-Field Magnetic Resonance Imaging Magnets" Front. Phys. (Jul. 28, 2021), the disclosures of which are incorporated by reference herein in their respective entireties. However, these techniques are generally directed to non-iterative, one time optimization of the shimming arrangement and, for various reasons, are generally not applicable to further iterations and/or optimization of the shimming arrangement to improve the main magnetic field $B_0$ homogeneity for LF-MRI systems utilizing a modified Halbach arrangement of permanent magnets. Accordingly, there exists a need for alternate systems and methods for passive shimming of LF-MRI systems, as further described herein.

The present disclosure provides systems and methods for passive shimming of LF-MRI systems. In several aspects, shimming can be employed using an MRI system including a shim tray and an array of permanent magnets in a modified Halbach dome arrangement. The array of permanent magnets can include one closed end forming a dome and one open end opposite to the closed end, where the open end comprises an opening sized to receive a head of a patient. Further, the array of permanent magnets can be configured to generate a main magnetic field $B_0$ having a low field strength in a region of interest. The shim tray can define a dome shape and can be segmented such that, when assembled, it seats within the dome defined by the array of permanent magnets. Further, the shim tray can include shim tray slots configured to receive shim magnets.

In one aspect, each of the shim tray slots can be configured to orient a corresponding one of the shim magnets received therein in a first configuration or a second configuration. For example, when in the first configuration, the corresponding shim magnet can generate a magnetic field that is in alignment with the direction of the main magnetic field $B_0$ in the region of interest. When in the second configuration, the corresponding shim magnet can generate a magnetic field that is reverse to the direction of the main magnetic field $B_0$ in the region of interest. As another example, when in the first configuration, a pole of the corresponding shim magnet can be facing a first direction. When in the second configuration, the pole of the corresponding shim magnet can be facing a second direction that is opposite the first direction.

According to several aspects of the present disclosure, to perform shimming using the above system, a first field map of the magnetic field $B_0$ can be measured while each of the shim tray slots is empty. The first field map is then applied to a genetic algorithm to determine a first set (e.g., a first subset) of shim tray slots to populate with the shim magnets. The first set of shim tray slots is then populated with the shim magnets (e.g., shim magnets are installed in the first set of shim tray slots). A second field map of the magnetic field $B_0$ is measured while the first set of shim tray slots is populated with the shim magnets. The second field map is then applied to the genetic algorithm to determine a second set (e.g., a second subset) of shim tray slots to populate with the shim magnets. The second set of shim tray slots is populated with the shim magnets. This iterative process can be repeated (e.g., measuring a third field map, determining a third set of shim tray slots, populating the third set of shim tray slots, measuring a fourth field map, and so on), for example, until a desired magnetic field $B_0$ homogeneity is achieved, until the difference in magnetic field $B_0$ homogeneity across iterations satisfies a predetermined threshold, and/or until a desired number of iterations has been completed.

In at least one aspect of the present disclosure, when applying the second field map to the genetic algorithm to determine the second set of shim tray slots to populate with the shim magnets, the genetic algorithm is constrained to consider only unpopulated shim tray slots (e.g., slots that are not included in the first set of shim tray slots) as candidates for the second set of shim tray slots. Thus, the systems and methods disclosed herein can enable a single shim tray to be selectively populated during multiple shimming iterations to achieve incremental improvements in main magnetic field $B_0$ homogeneity. This approach can therefore avoid potential issues associated with using multiple shim trays that, when stacked, increasingly reduce the size of the inner bore of the MRI system (e.g., limiting the available space for receiving the head of a patient) and/or requiring a larger MRI housing at the outset to accommodate more than one shim tray therein. Furthermore, by constraining the algorithm to consider only unpopulated shim tray slots, the systems and methods disclosed herein can enable an iterative shimming approach where the adjustments made in a previous iteration (e.g., populating the first set of shim tray slots) are accounted for in subsequent iterations.

In at least one aspect of the present disclosure, determining the set of shim tray slots to populate with the shim magnets by applying the field map to the genetic algorithm can include determining, for each of the set of shim tray slots, whether to populate the shim tray slot with a shim magnet oriented in a first configuration (e.g., to generate a magnetic field that is in alignment with the direction of the main magnetic field $B_0$ in the region of interest) or a second configuration (e.g., to generate a magnetic field that is in reverse the direction of the main magnetic field $B_0$ in the region of interest). This approach can identify of potential improvements to main magnetic field $B_0$ homogeneity that may be unexpectedly achieved by populating one or more of the unpopulated shim trays with a magnet that is oriented to generate a magnetic field with field lines that are reverse to the direction of the main magnetic field $B_0$ in the region of interest (e.g., rather than only considering populating shim trays with magnets oriented to generally complement and/or augment the main magnetic field $B_0$ in the region of interest). Stated another way, this approach can identify of potential improvements to main magnetic field $B_0$ homogeneity that may be unexpectedly achieved by populating one or more of the unpopulated shim trays with a magnet that is oriented in a direction that is opposite to the array of permanent magnets arranged in the modified Halbach dome orientation In at least one aspect of the present disclosure, determining the set of shim tray slots to populate with the shim magnets by applying the field map to the genetic algorithm can include determining, for each of the set of shim tray slots, a strength of the corresponding one of the shim magnets for populating the shim tray slot. For example, the genetic algorithm can be configured to consider populating a given shim tray slot with either a first shim magnet having a first strength (e.g. N52) or a second shim magnet having a second strength (e.g., N42). This approach can take advantage of the potential to increase the main magnetic field $B_0$ homogeneity by populating the shim tray slots with magnets having differing strengths. As another example, the genetic algorithm can be configured to consider populating a given shim tray slot with one of more than two different strength shim magnets (e.g., one of three shim magnet options each having differing strengths, one of four shim magnet options each having differing strengths, etc.).

In at least one aspect of the present disclosure, the shim tray slots of the shim tray can each be configured to receive the same size shim magnet. And, in another aspect, rather than using a custom shim tray with slots specifically selected based on a shimming simulation for a particular MRI system, the shim tray and the shim tray slots provided herein can include a standardized configuration that allow that same shim tray design to be applied across multiple different MRI systems. These and other aspects of the present disclosure can provide manufacturing-related benefits. For example, during production of multiple LF-MRI systems, although each LF-MRI system may have the same permanent magnet array design, because of build error, each LF-MRI system may not produce a main magnetic field $B_0$ having the same homogeneity. Thus, each LF-MRI system may require unique shimming. Rather than building a custom shim tray for each LF-MRI system, the present disclosure can enable identical or substantially identical shim trays to be used to shim each LF-MRI system, with each shim tray being selectively and/or iteratively populated with shim magnets based on the output of the genetic algorithm.

FIGS. 9-12 depict a shim tray 900, in accordance with at least one aspect of the present disclosure. The shim tray 900 is shaped to be seated or otherwise positioned within a dome-shaped housing of an LF-MRI system, such as, for example, a dome shaped housing similar to the dome-shaped housing 102 of the MRI system 100 described above with respect to FIG. 1.

As noted above, various LF-MRI systems disclosed herein can comprise an array of permanent magnets that are configured generate a main magnetic field $B_0$ in a region of interest. The array of permanent magnets may be arranged in a modified Halbach dome arrangement optimized for imaging the head of a patient (e.g., as described in the aforementioned publications by McDaniel and/or as described in the aforementioned International Patent Application No. PCT/US2022/72143, titled NEURAL INTERVENTIONAL MAGNETIC RESONANCE IMAGING APPARATUS, filed May 5, 2022). For example, in the modified Halbach dome arrangement, the array of permanent magnets can include one closed end forming a dome and one open end opposite to the closed end, where the open end comprises an opening sized to receive a head of a patient. The modified Halbach dome orientation can be different from, for example, a Halbach cylinder arrangement, which can include two open ends (e.g., open at opposite ends of the cylinder) and is defined by stacked rings of magnets that are arranged in a rotating pattern of magnetism to produce a substantially uniform field inside the resulting cylinder. Generally, in order to maintain a Halbach array, the modified Halbach dome arrangement can include a more complex arrangement of magnets compared to the Halbach cylinder arrangement because, unlike the Halbach cylinder, which can be symmetrical from end to end, the modified Halbach dome arrangement of magnets can have an open end and a dome-shaped closed end opposite the open end.

In various aspects, a modified Halbach dome arrangement of magnets can define an exterior radius $r_{ext}$ and interior radius $r_{in}$ at the base of the dome. The modified Halbach dome arrangement may comprise an elongated cylindrical portion that extends from the base of the dome. In one aspect, the elongated cylindrical portion comprises the same exterior radius and interior radius as the base of the dome and continues from the base of the dome at a predetermined length, at a constant radius. In another aspect, the elongated cylindrical portion comprises a different exterior radius and interior radius than the base of the dome. The different exterior radius and interior radius of the elongated cylindrical portion merges with the base radii in a transitional region.

Figure 9:
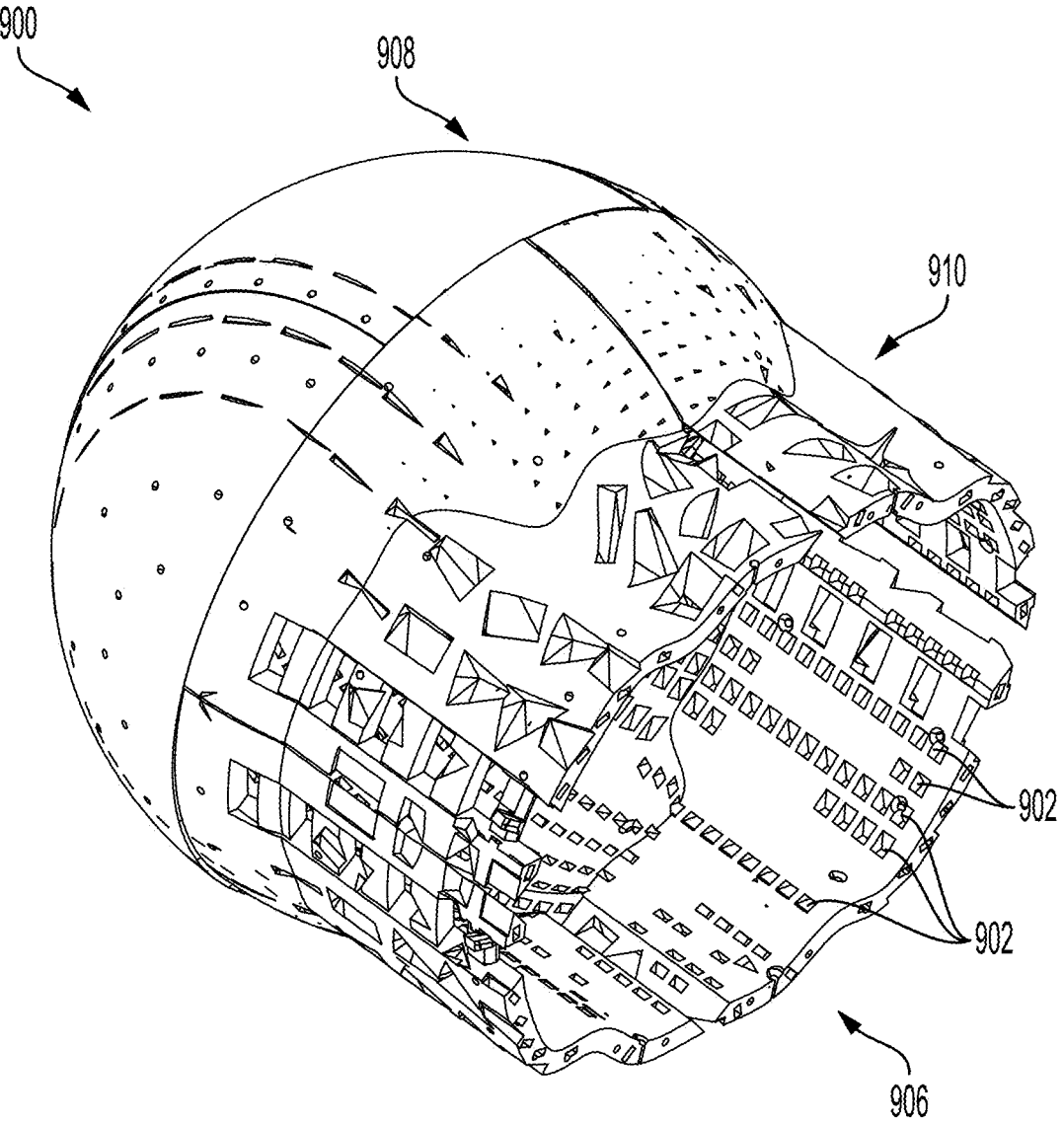
FIG. 9 is a perspective view of the shim tray for passive shimming, in accordance with at least one aspect of the present disclosure.
Figure 12:
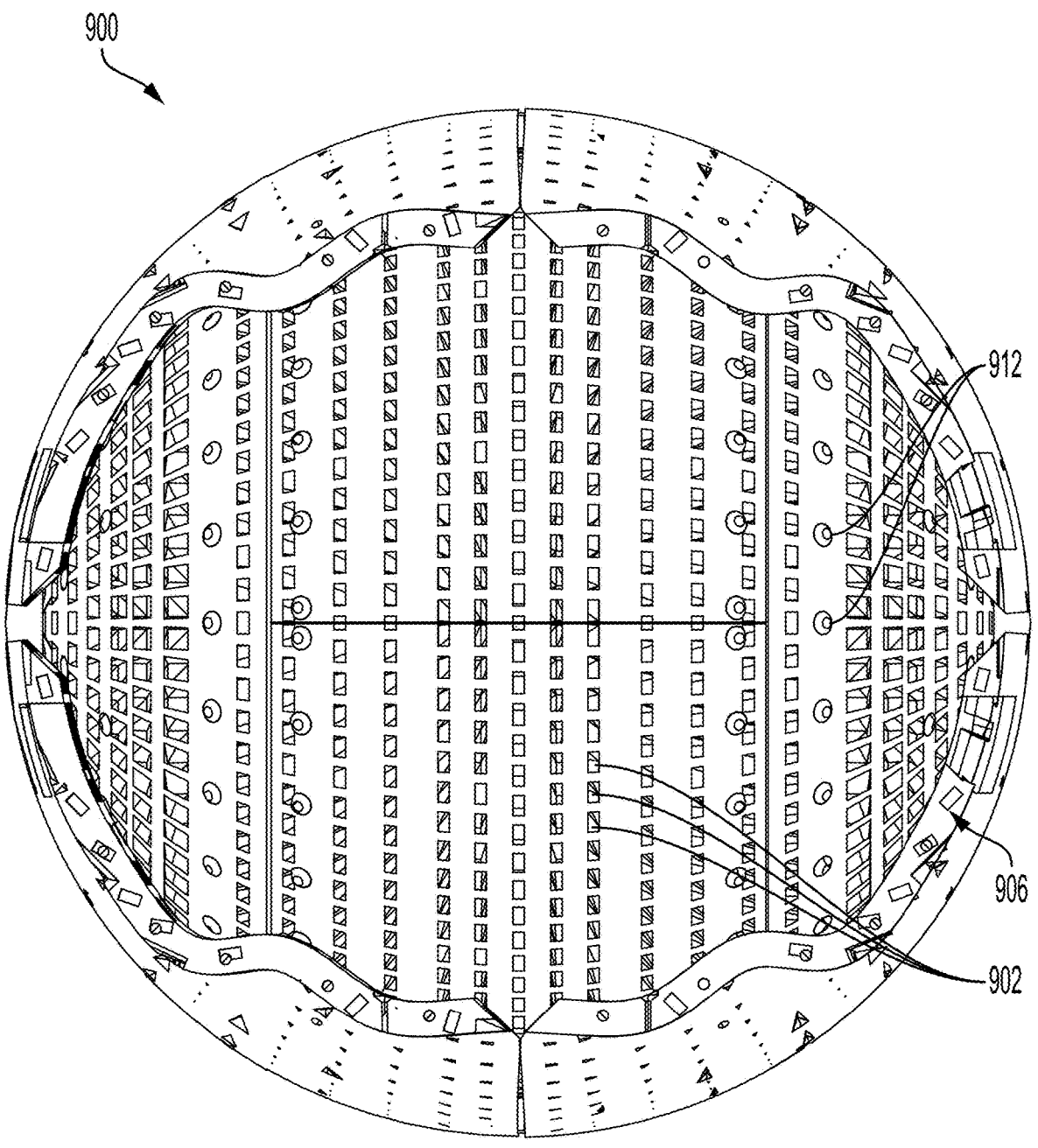
FIG. 12 is another side view of the shim tray of FIG. 9, in accordance with at least one aspect of the present disclosure.

Returning to FIGS. 9-12, the shim tray 900 is shaped to be positioned within and at least partially surrounded by an array of permanent magnets that are oriented according to a modified Halbach dome arrangement. As also noted above, LF-MRI systems and corresponding modified Halbach dome arrangements of permanent magnets disclosed herein can be configured for imaging the head of a patient and therefore include an opening sized to receive the head of the patient. As best shown by FIGS. 9 and 12, the shim tray 900 includes an opening 906 at one end that is sized to receive the head of a patient. When an LF-MRI system comprising the shim tray 900 receives the head of a patient, the shim tray 900 is positioned intermediate the modified Halbach dome arrangement of permanent magnets and the head of the patient.

In some aspects, the shim tray 900 can include a spherical and/or dome-shaped portion 908 and a substantially cylindrical portion 910 extending from the dome shaped portion 908. The substantially cylindrical portion 910 can define the opening 906 for receiving the head of a patient. The dome-shaped portion 908 and the substantially cylindrical portion 910 can be sized to seat within or otherwise correspond to a dome-shaped portion and substantially cylindrical portion of the modified Halbach dome arrangement of permanent magnets of an LF-MRI system.

Figure 10:
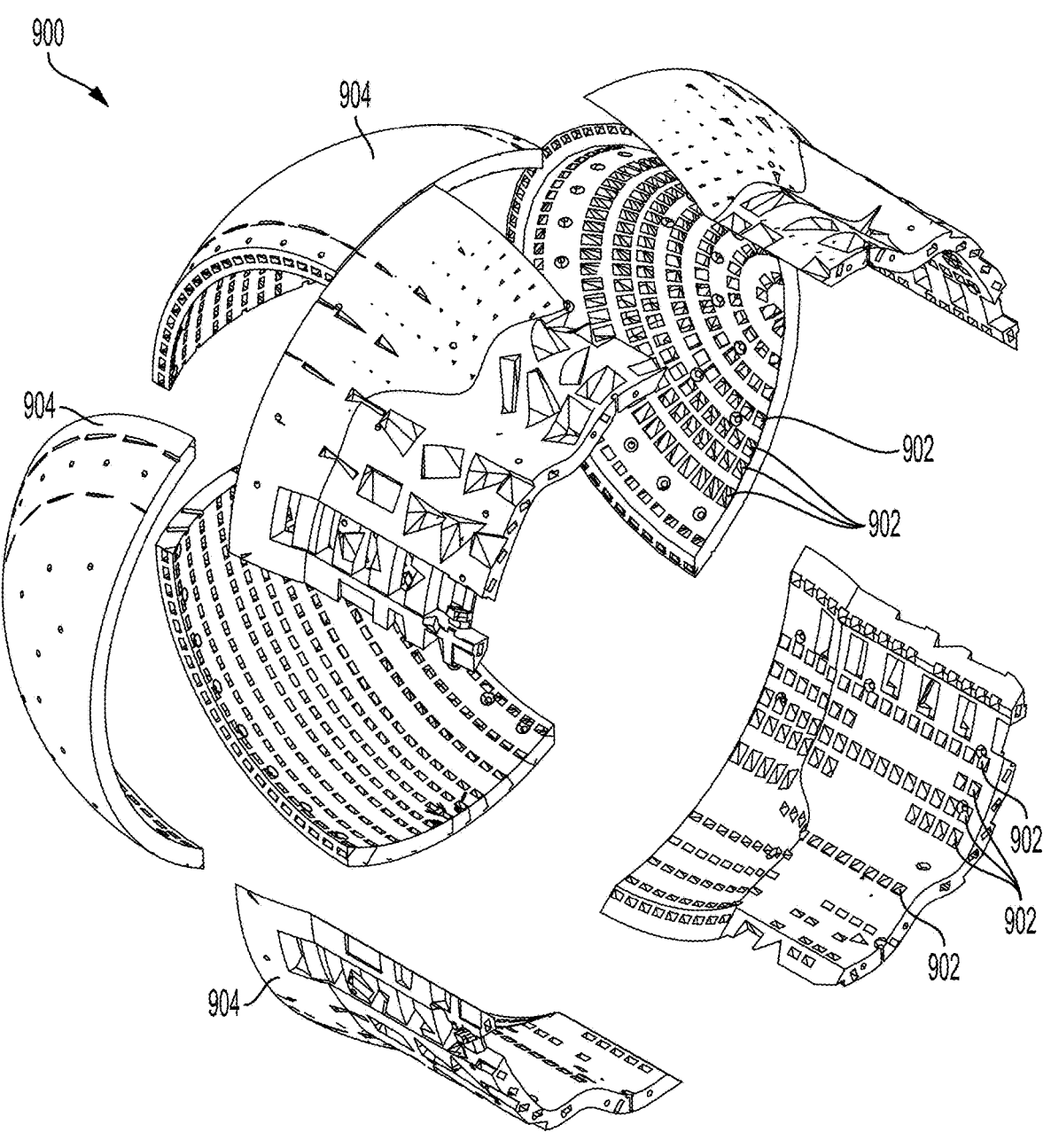
FIG. 10 is an exploded perspective view of the shim tray of FIG. 9, in accordance with at least one aspect of the present disclosure.
Figure 11:
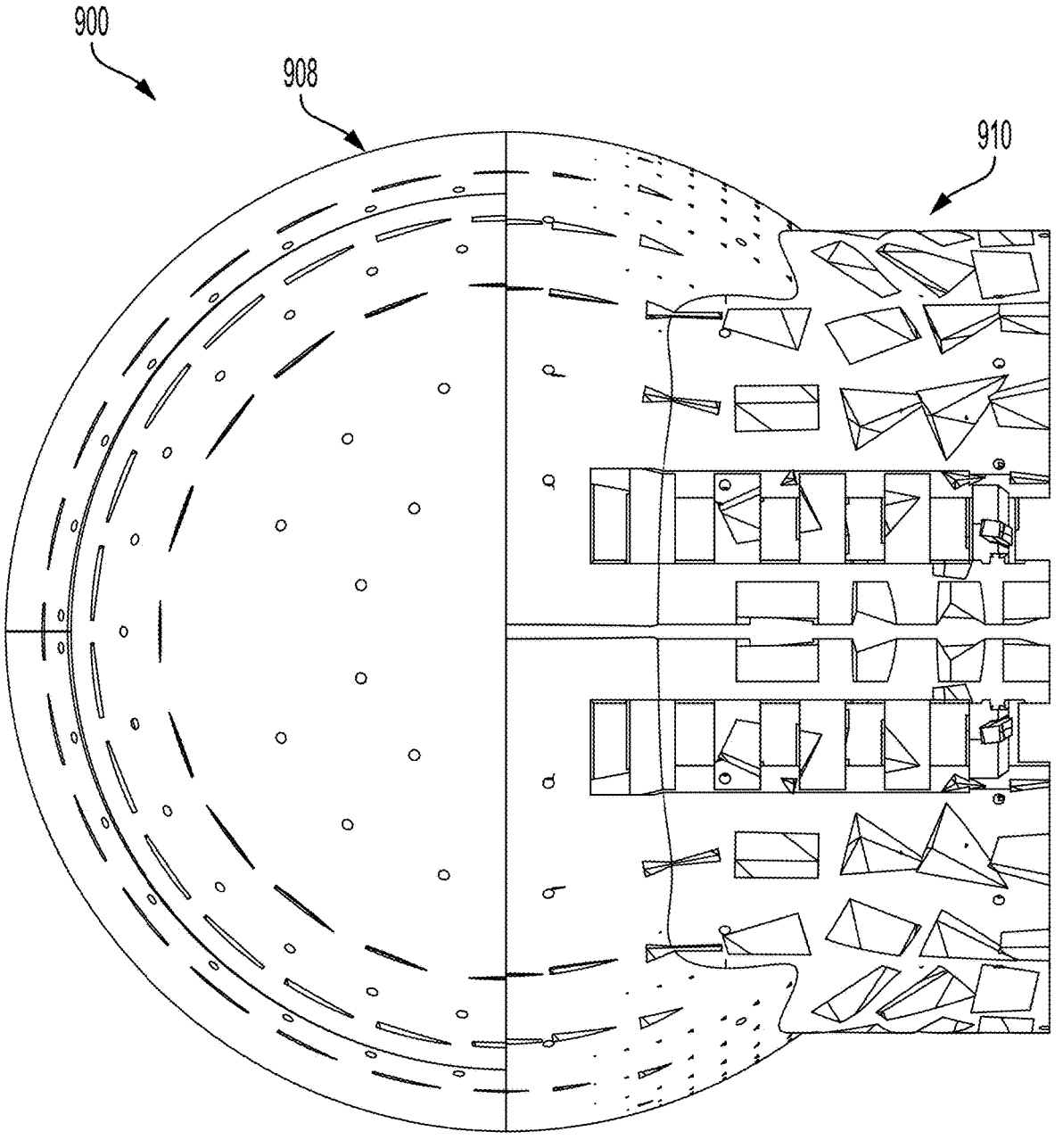
FIG. 11 is a side view of the shim tray of FIG. 9, in accordance with at least one aspect of the present disclosure.

In some aspects, as best shown by FIG. 10, the shim tray 900 can be constructed from multiple panels 904. Each of the panels 904 may be sized to be insertable into an opening defined by the modified Halbach dome arrangement of permanent magnets of an LF-MRI system, thereby enabling the shim tray 900 to be assembled and positioned within the modified Halbach dome arrangement of permanent magnets. Although the shim tray 900 depicted by FIGS. 9-12 comprises a specific configuration of panels 904, the shim tray 900 may be configured with any suitable number and arrangement of panels 904. In other aspects, the shim tray 900 may be formed from a single piece of material and/or may not comprise separate panels 904.

Figure 13:
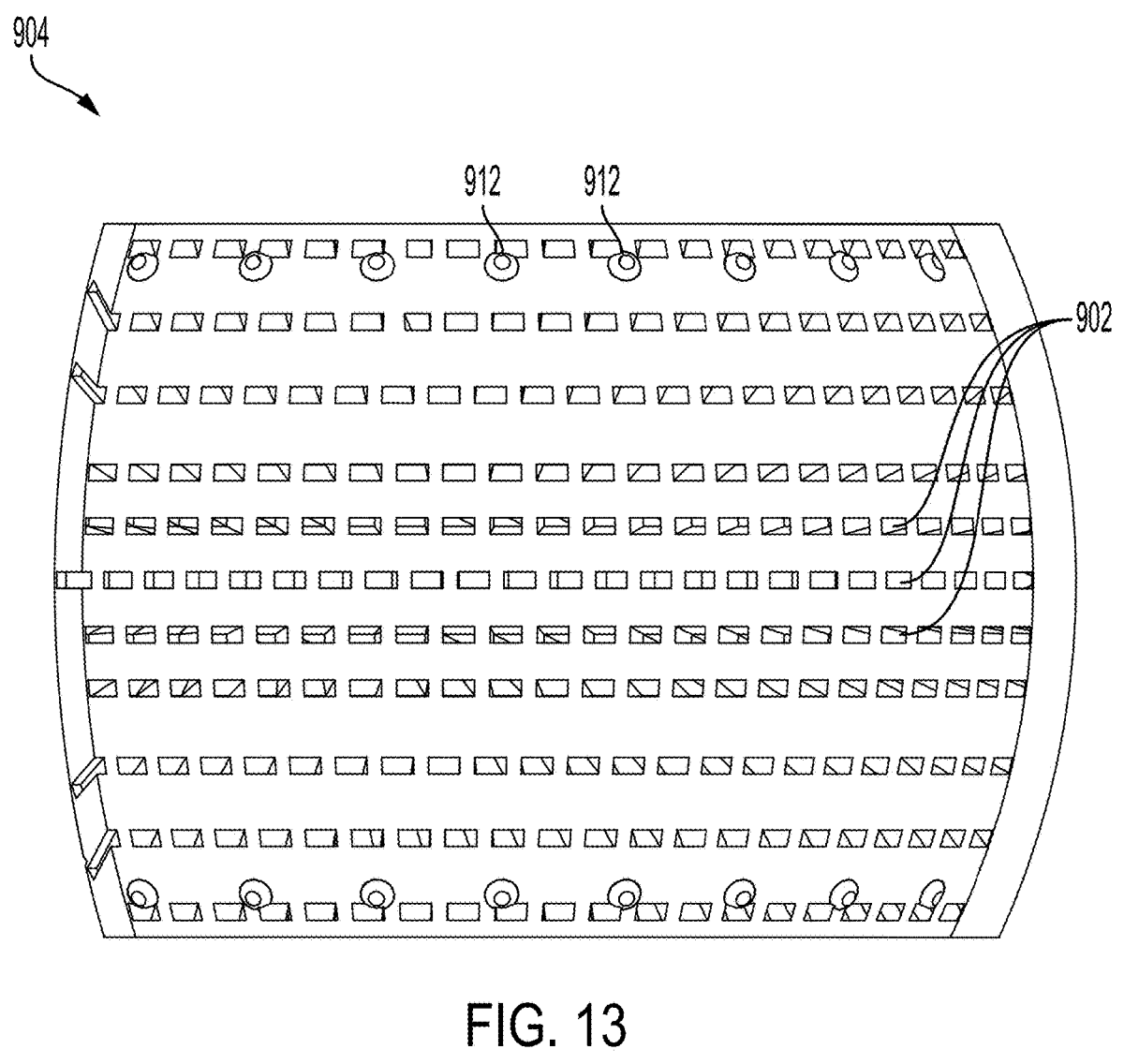

FIG. 13 depicts an example panel 904 of the shim tray 900, according to at least one aspect of the present disclosure. The panel 904 can include holes 912. Each of the holes 912 may be configured to receive a fastener for fastening the panel 904 to another panel 904 to construct or otherwise assemble the shim tray 900. The holes 912 can be configured to accept any type of fastener suitable for use with an MRI system, such as a faster constructed of a non-ferromagnetic material, for example.

Figure 12A:
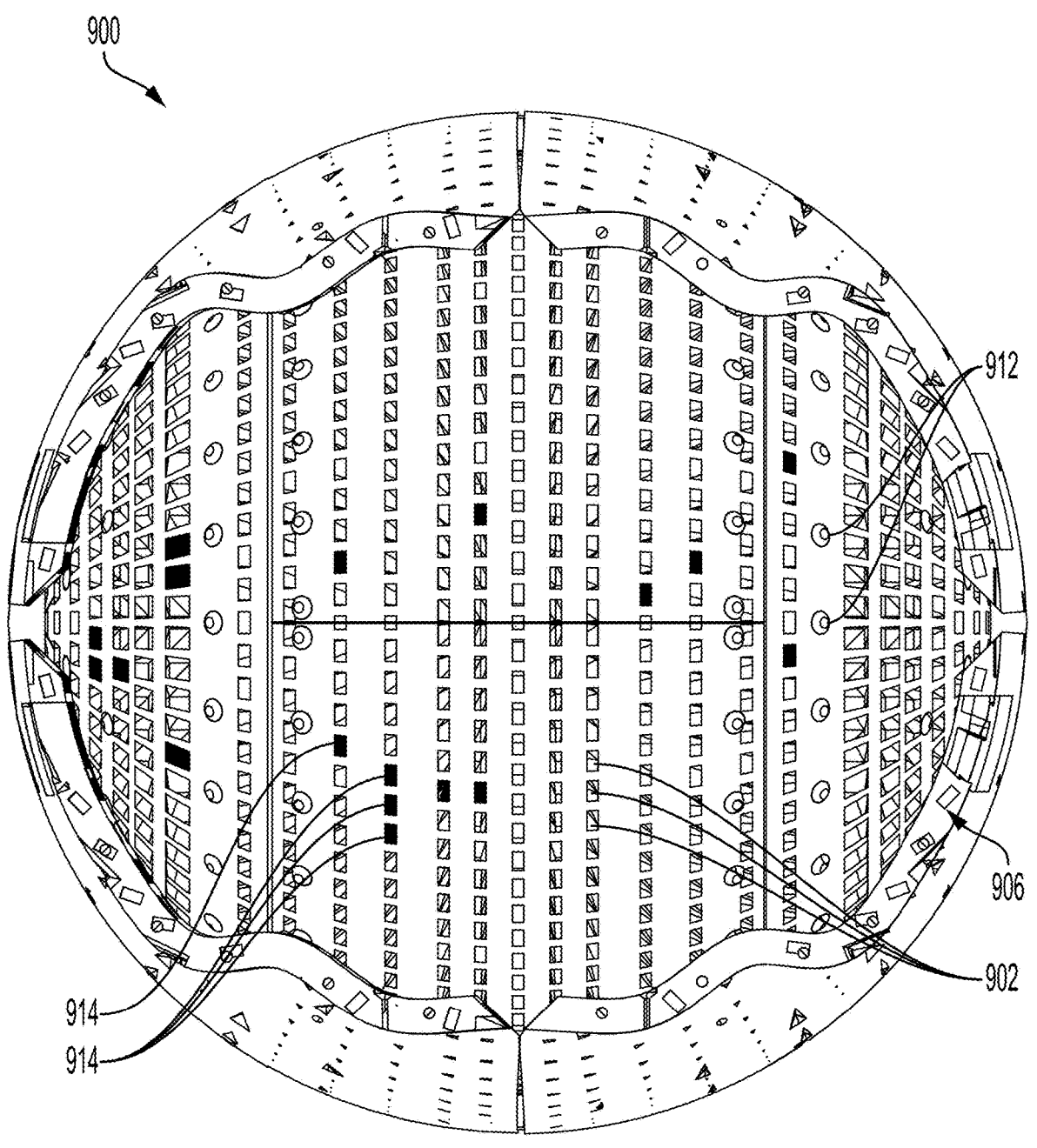
FIG. 12A is another side view of the shim tray of FIG. 9 with a subset of shim tray slots selectively populated with shim magnets, in accordance with at least one aspect of the present disclosure.

Referring now to FIGS. 9-13, the shim tray 900 can include shim tray slots 902. Each of the shim tray slots 902 can be shaped or otherwise configured to receive and/or support a shim magnet 914. For example, FIG. 12A shows the shim tray 900 of FIG. 12, except that an illustrative subset of shim tray slots 902 are selectively populated with shim magnets 914, according to one aspect of the present disclosure.

As noted above, the shim tray 900 is usable with and positionable within an LF-MRI system comprising an array of permanent magnets in a modified Halbach dome arrangement. The array of permanent magnets can be configured to generate a main magnetic field $B_0$ within a region of interest. When positioned in the LF-MRI system comprising the array of permanent magnets, each of the shim tray slots 902 can be shaped or otherwise configured to orient a shim magnet 914 received therein in one of a set of possible configurations. In some aspects, the set of possible configurations includes a first configuration or a second configuration. For example, when a shim magnet 914 is placed within one of the shim tray slots 902 in a first configuration, the shim magnet 914 may act to augment the strength of the main magnetic field $B_0$ generated by the surrounding array of permanent magnets (e.g., the magnetic field generated by the shim magnet 914 can be in alignment with the direction of the main magnetic field $B_0$ in the region of interest). When a shim magnet 914 is placed within the same one of the shim tray slots 902 in a second configuration, the shim magnet may act to decrease the strength of the main magnetic field $B_0$ generated by the surrounding array of permanent magnets (e.g., the magnetic field generated by the shim magnet can be reverse to the direction of the main magnetic field $B_0$ in the region of interest). In one aspect, when in the first configuration, a pole of the corresponding shim magnet 914 can be facing a first direction. When in the second configuration, the pole of the corresponding shim magnet 914 can be facing a second direction that is opposite the first direction.

In some aspects, the set of possible configurations includes eight different configurations. For example, the shim tray slots 902 can be configured to receive shim magnets 914 (e.g., magnet carriers) having eight sides. Each of the eight different configurations can correspond to a different side of the shim magnet 914 facing the base of the shim tray slot 902 when inserted therein. Accordingly, each of the eight different configurations can correspond to eight different orientations of the pole of the shim magnet 914 relative to the direction of the main magnetic field $B_0$.

In some aspects, each of the shim tray slots 902 is configured to receive an end portion of the shim magnet 914. In some aspects, each of the shim tray slots 902 is configured to receive the same size end portion. For example, the rectangular openings defined by the shim tray slots 902 depicted in FIGS. 9-13 can vary in size due various portions of the shim tray 900 having a curved interior profile. Each of the shim tray slots 902 can define a cavity and the cavities may also vary in size (e.g., having different sidewall depth based on where the corresponding shim tray slot 902 is formed along the interior profile of the shim tray 900). Although the cavities defined by the shim tray slots 902 may vary in size, each of the cavities defined by the shim tray slots 902 can be shaped to receive the same size end portion of a shim magnet 914. Furthermore, although the shim tray slots 902 can be shaped to receive the same size end portion of a shim magnet 914, the shim tray slots 902 can nevertheless be shaped to receive shim magnets 914 of different sizes. For example, a first shim magnet 914 can have a cuboid shape with dimensions of 10 mm×10 mm×5 mm. A second shim magnet 914 can have a cuboid shape with dimensions of 10 mm×10 mm×10 mm. Both the first shim magnet 914 and the second shim magnet 914 have an end portion with a square cross section of 10 mm×10 mm. The shim tray slots 902 can be shaped to accommodate this sized end portion. However, when installed in one of the shim tray slots 902, the second shim magnet 914 may protrude further out of the shim tray slot than the first shim magnet 914. When the shim tray 900 is positioned in an LF-MRI system comprising the array of permanent magnets generating a main magnetic field $B_0$, selectively populating the shim tray slots 902 with shim magnets 914 (e.g., according to the method 1400 and/or the method 1600 described below) can cause an increase in the homogeneity of the main magnetic field $B_0$.

The shim tray 900 can be constructed from any material suitable for MRI. For example, the shim tray 900 may comprise a non-ferrous material such as, polycarbonate, acrylonitrile butadiene styrene (ABS), polycarbonate/acrylonitrile butadiene styrene (PC-ABS), nylon, or polyoxymethylene (Delrin), or a combination thereof. Various additive and subtractive manufacturing techniques may be used to construct the shim tray 900. For example, the shim tray 900 may be formed via 3D printing, injection molding, and/or CNC machining.

Figure 14:
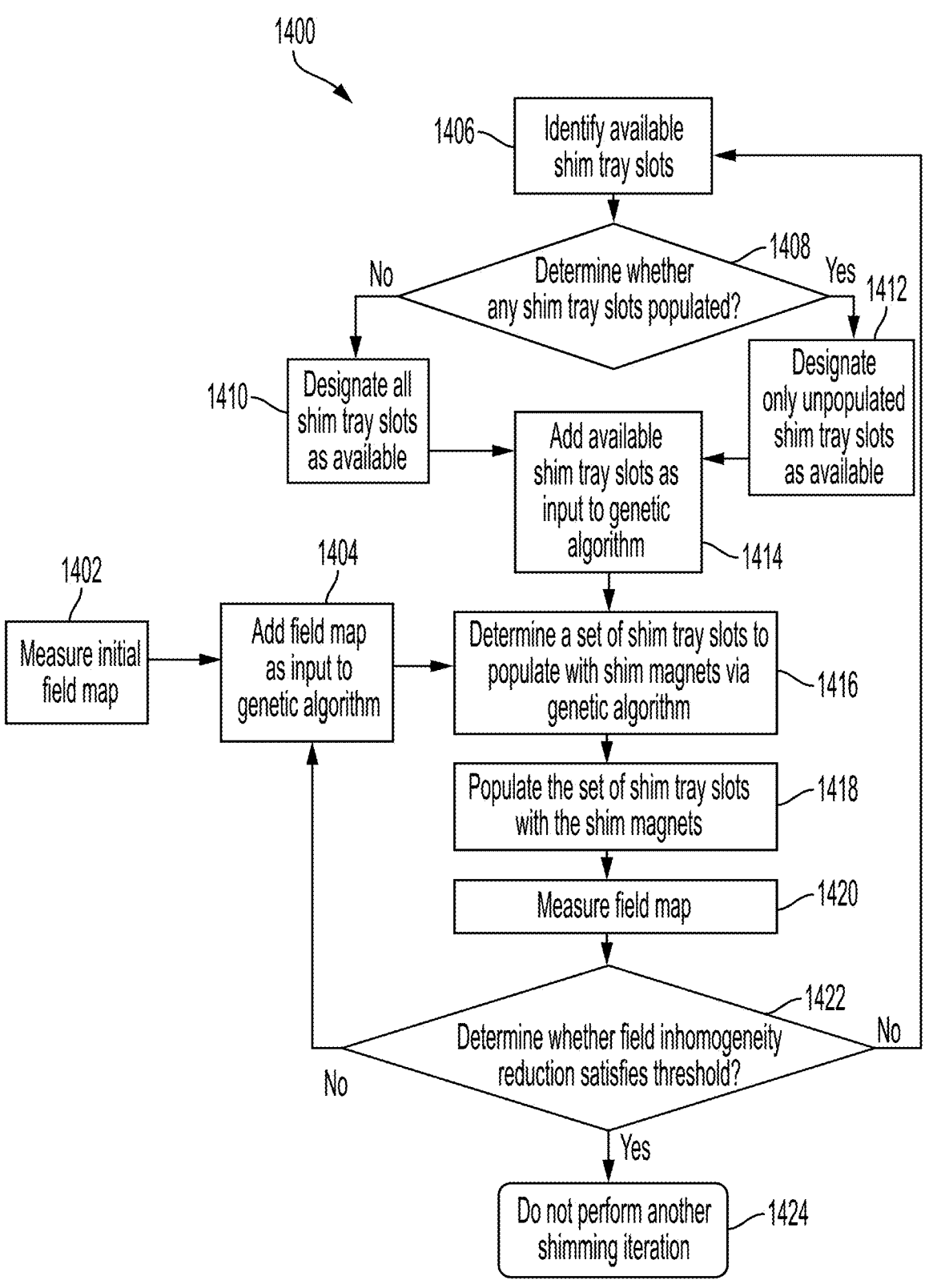
FIG. 14 depicts a flow chart of a method of passive shimming for an MRI system, in accordance with at least one aspect of the present disclosure.

FIG. 14 depicts a flow chart of a method 1400 of passive shimming for an MRI system, according to at least one aspect of the present disclosure. The method 1400 can be carried out using various MRI systems disclosed herein such as, for example, the MRI system 100 (FIG. 1) equipped with the shim tray 900 (FIGS. 9-12). As noted above, the MRI system 100 can include an array of permanent magnets configured to generate a main magnetic field $B_0$ having a low field strength, such as approximately 70 mT, for example. The shim tray 900 can include an arrangement of shim tray slots 902 configure to receive shim magnets 914. Some aspects of the method 1400 may be carried out based on instructions stored on a memory that are executed by a processor.

Referring primarily to FIG. 14, and also to FIGS. 9-12, according to the method 1400, an initial field map of the main magnetic field $B_0$ is measured 1402. Various sensors can be used to measure 1402 the field map of the main magnetic field $B_0$, such as, for example, a Hall effect sensor (e.g., a 3-axis Hall probe) and/or an nuclear magnetic resonance (NMR) probe.

According to the method 1400, the available shim tray slots 902 are identified 1406. In some aspects, all of the shim tray slots 902 of the shim tray 900 may be identified 1406 as available. In other aspects, a user may designate one or more of the shim tray slots 902 as unavailable (e.g., based on user preference, based on prior shimming experience, etc.). In some aspects, the available shim tray slots 902 are automatically identified 1406 based on instructions stored on a memory that are executed by a processor. For example, characteristics of the shim tray 900, such as the number and positions of the shim tray slots 902, can be stored to the memory and can be retrieved to identify 1406 the available shim tray slots 902.

Still referring primarily to FIG. 14, and also to FIGS. 9-12, according to the method 1400, it is determined 1408 whether any of the shim tray slots 902 are populated with shim magnets 914. For example, where an initial iteration of the method 1400 has not yet been performed, it may be determined 1408 that none of the shim tray slots 902 are populated with shim magnets 914. Accordingly, all of the shim tray slots 902 may be designated 1410 as available for population with shim magnets 914. As explained further below, where one or more iterations of the method 1400 have been performed, it may be determined 1408 that some of the shim tray slots 902 are populated with shim magnets 914 and only the unpopulated shim tray slots 902 may be designated 1412 as available. In some aspects, the determination 1408 of whether any of the shim tray slots 902 are populated and the designation 1410, 1412 of available shim tray slots 902 may be carried out by automatically based on instructions stored in the memory that are executed by the processor. For example, instructions stored in the memory may cause the processor to determine whether previous iterations of the method 1400 have been executed in order to determine 1408 whether any of the shim tray slots 902 are populated with shim magnets 914.

Still referring primarily to FIG. 14, and also to FIGS. 9-12, according to the method 1400, the measured 1402 initial field map is added 1404 as an input to a genetic algorithm and the shim tray slots 902 designated 1410, 1412 as available for population with shim magnets 914 are added 1414 as an input to the genetic algorithm. Notably, rather than reliance on simulated field data as input, the optimization input to the genetic algorithm at 1414 can include measured field data, such as magnetic field data obtained with a magnetometer (e.g., a 3-axis Hall probe and/or NMR probe). Using measured field data as optimization input can help to compensate for mounting tolerance of the shim magnets 914 and/or probe registration errors, for example.

Based on the optimization inputs, a set (e.g., a subset) of shim tray slots 902 to populate with shim magnets 914 is determined 1416 using a genetic algorithm. For example, the genetic algorithm can be configured to determine 1416 the combination of shim tray slots 902 that, when populated with shim magnets 914, will cause the greatest increase in main magnetic field $B_0$ homogeneity. The genetic algorithm can also be configured to consider whether to populate one or more of the shim tray slots 902 with shim magnets 914 of different strengths and/or whether to populate one or more of the shim tray slots 902 with shim magnets 914 oriented in a first configuration (e.g., to generate a magnetic field that is in alignment with a direction of the main magnetic field $B_0$ in the region of interest) or a second configuration (e.g., to generate a magnetic field that is reverse to the direction of the main magnetic field $B_0$ in the region of interest). In some aspects, the genetic algorithm may be implemented according to the genetic algorithm 1500 discussed below with respect to FIG. 15. In some aspects, the genetic algorithm may be carried out as described in the aforementioned publication by Cooley et al. titled "Design of sparse Halbach magnet arrays for portable MRI using a genetic algorithm," published in *IEEE transactions on magnetics,* 54(1), 5100112 in 2018, which, as noted above, is incorporated by reference herein in its entirety. In some aspects, the genetic algorithm may be stored on the memory as instructions executable by the processor.

Still referring primarily to FIG. 14, and also to FIGS. 9-12, according to the method 1400, the set of shim tray slots 902 are physically populated with shim magnets 914 (e.g., the shim magnets are installed in the set of shim tray slots 902) according to the above determination 1416 by the genetic algorithm. With the set of shim tray slots 902 populated by the shim magnets 914, another field map of the main magnetic field $B_0$ is measured 1420. The field map may be measured 1420 using any of various sensors described above with respect to measuring 1402 the initial field map.

Still referring primarily to FIG. 14, and also to FIGS. 9-12, according to the method 1400, a determination 1422 is made as to whether a reduction in the inhomogeneity of the main magnetic field $B_0$ satisfies a predetermined threshold. For example, the most recently measured 1420 field map (e.g., the field map of the current iteration of the method 1400) can be compared with the filed map measured 1402, 1420 immediately prior to the most recently the most recently measured 1420 field map (e.g., the field map of the previous iteration or the initial field map) to determine a change in the inhomogeneity of the main magnetic field $B_0$. Then, if the change in the inhomogeneity of the main magnetic field $B_0$ satisfies a predetermined threshold, then another iteration of the method 1400 may not be performed 1424 (e.g., the passive shimming process is complete). If the change in the inhomogeneity of the main magnetic field $B_0$ does not satisfy the predetermined threshold, then another iteration of the method 1400 may commence again identifying 1406 the available shim tray slots 902 and determining 1408 whether any shim tray slots 902 are populated.

Still referring primarily to FIG. 14, and also to FIGS. 9-12, according to the method 1400, where a second or subsequent iteration of the method 1400 is being performed, at least some of the shim tray slots 902 will have been populated with shim magnets 914 from the previous iteration. Accordingly, determining 1408 whether any shim tray slots are populated can include identifying the shim tray slots 902 that were populated with shim magnets 914 during the previous iteration(s) of the method 1400. For example, where a third iteration of the method 1400 is being performed, the shim tray slots 902 populated with shim magnets 914 will include the shim tray slots 902 populated with shim magnets 914 during the first iteration of the method 1400 and the shim tray slots 902 populated with shim magnets 914 during the second iteration of the method 1400. Where at least some of the shim tray slots 902 are determined 1408 to be populated with shim magnets 914, only unpopulated shim tray slots 902 may be designated 1412 as available for population in the current iteration. In some aspects, the determination 1408 of whether any of the shim tray slots 902 are populated and the designation 1412 of only unpopulated shim tray slots 902 as available for population may be carried out automatically based on instructions stored in the memory that are executed by the processor. For example, instructions stored in the memory may cause the processor to determine whether previous iterations of the method 1400 have been executed in order to determine 1408 whether any of the any of the shim tray slots 902 are populated with shim magnets 914.

Still referring primarily to FIG. 14, and also to FIGS. 9-12, according to the method 1400, where a second or subsequent iteration of the method 1400 is being performed, the method 1400 may proceed as described above by adding 1404 the previously measured 1420 field map and adding

1414 the available shim tray slots 902 as inputs to the genetic algorithm, determining 1416 a next set of shim tray slots to populate, populating the next set of shim tray slots 1418, measuring a field map 1420, and determining 1422 whether a reduction in field inhomogeneity satisfies a predetermined threshold.

FIG. 15 depicts a flow chart of a genetic algorithm 1500, according to at least one aspect of the present disclosure. As noted above, the genetic algorithm 1500 may be implemented to determine 1416 a set of shim trays 902 to populate with shim magnets 914 as part of the method 1400 described above with respect to FIG. 14. In some aspects, the genetic algorithm 1500 may be similar to the genetic algorithm described in the aforementioned publication by Cooley et al. titled "Design of sparse Halbach magnet arrays for portable MRI using a genetic algorithm," published in *IEEE transactions on magnetics,* 54(1), 5100112 in 2018, which, as noted above, is incorporated by reference herein in its entirety. Any aspects of the genetic algorithm described by Cooley may be implemented as part of the genetic algorithm 1500.

Referring primarily to FIG. 15, and also to FIGS. 9-12, according to the genetic algorithm 1500, a parent generation of candidate shim tray slot population sets is generated 1502. For example, generating 1502 each candidate shim tray slot population set of for the parent generation can include randomly selecting a combination of one or more than one of the shim tray slots 902 to simulate being populated with a shim magnet 914. Each of the candidate shim tray slot population sets can be defined by a set of population values, with each value corresponding to one of the shim tray slots. Slots to be simulated as not being populated with a shim magnet 914 are designated as value=0 and slots to be simulated as being populated with a shim magnet 914 are designated as value=1. Thus, two simulation options (k=2) may be made available for each shim tray slot 902.

In one aspect of the algorithm 1500, randomly selecting a combination of one or more than one of the shim trays 902 to simulate being populated with a shim magnet 914 can include randomly selecting whether to populate one or more than one of the shim tray slots 902 with either a shim magnet 914 oriented in a first configuration (e.g., to generate a field in alignment with the main magnetic field $B_0$) or a second configuration (e.g., to generate a field that is reverse to the direction of the main magnetic field $B_0$). In this aspect, slots to be simulated as not being populated with a shim magnet 914 are designated as value=0, slots to be simulated as being populated with a shim magnet 914 oriented in the first configuration are designated as value=1, and slots to be simulated as being populated with a shim magnet oriented in the second configuration are designated as value=2. Thus, three simulation options (k=3) may be made available for each shim tray slot 902.

In one aspect of the algorithm 1500, randomly selecting a combination of one or more than one of the shim trays 902 to simulate being populated with a shim magnet 914 can include randomly selecting whether to populate one or more than one of the shim trays 902 with a magnet oriented in the first configuration having a first strength, a magnet oriented in the first configuration having a second strength, a magnet oriented in the second configuration having the first strength, or a magnet oriented in the second configuration having the second strength. In this aspect, slots to be simulated as not being populated with a shim magnet are designated as value=0, slots to be simulated as being populated with a shim magnet oriented in the first configuration and having the first strength are designated as value=1, slots to be simulated as being populated with a shim magnet oriented in the second configuration and having the first strength are designated as value=2, slots to be simulated as being populated with a shim magnet oriented in the first configuration and having the second strength are designated as value=3, and slots to be simulated as being populated with a shim magnet oriented in the second configuration and having the second strength are designated as value=4. Thus, five simulation options (k=5) may be made available for each shim tray slot 902.

Generating 1502 the parent generation of candidate shim tray slot population sets can include generating 1502 two or more candidate shim tray slot population sets (e.g., three candidate shim tray slot population sets, four candidate shim tray slot population sets, five candidate shim tray slot population sets, ten candidate shim tray slot population sets, one hundred candidate shim tray slot population sets, greater than one hundred candidate shim tray slot population sets, etc.).

Referring still primarily to FIG. 15, and also to FIGS. 9-12, according to the genetic algorithm 1500, a simulated field map is generated 1504 for each of the parent candidate shim tray populate sets. Further, a child generation of candidate shim tray slot population sets is determined 1506 from the parent generation based on a tournament selection process. The tournament selection process can involve matching (e.g., comparing) candidate shim tray slot population sets from the parent generation against each other and allowing only a select number of the fittest candidates (e.g., candidate shim tray slot population sets having a simulated field map with the lowest inhomogeneity) to survive the tournament selection. The child generation of candidate shim tray slot population sets can be determined 1506, for example, by (i) designating one or more of the fittest parents as children, (ii) generating children based on combining portions of the sets of values defining two or more parents (e.g., two or more of the fittest parents), and/or (iii) introducing random mutations (e.g., random changes in the set of values) of a parent to generate a child.

Referring still primarily to FIG. 15, and also to FIGS. 9-12, according to the genetic algorithm 1500, it is determined 1508 whether the difference between the parent generation of candidate shim tray slot population sets and the child generation of candidate shim tray population sets satisfies a predetermined threshold. For example, as the difference in the set of values defining the parent and child generations becomes similar, it may indicate that the genetic algorithm 1500 is converging on a solution. Thus, subsequent iterations of the genetic algorithm 1500 may result in decreasing marginal improvements in simulated field homogeneity. If it is determined 1508 that the predetermined threshold is not satisfied, the child generation of candidate shim tray population sets can be designated 1510 as the parent generation for a next iteration of the algorithm 1500. Alternatively, if it is determined 1508 that the predetermined threshold is satisfied, then a candidate shim tray slot population set of the child generation can be identified 1512 as an output candidate shim tray slot population set of the algorithm 1500. For example, the candidate shim tray slot population set of the child generation corresponding to the simulated field map having the lowest inhomogeneity may be identified 1512 as an output candidate shim tray slot population set of the algorithm 1500. Referring again to FIG. 14, the output candidate shim tray population set identified 1512 by the genetic algorithm 1500 can correspond to the set of shim tray slots to populate with shim magnets determined 1416 as part of the method 1400.

FIG. 16 depicts a flow chart of a method 1600 of passive shimming for an MRI system, according to at least one aspect of the present disclosure. The method 1600 can be carried out using various MRI systems disclosed herein such as, for example, the MRI system 100 (FIG. 1) equipped with the shim tray 900 (FIGS. 9-12). As noted above, the MRI system 100 can include array of permanent magnets configured to generate a main magnetic field $B_0$ having a low field strength. The shim tray 900 can include shim tray slots 902 configured to receive shim magnets 914. Some aspects of the method may be carried out based on instructions stored on a memory that are executed by a processor.

Referring primarily to FIG. 16, and also to FIGS. 9-12, according to the method 1602, a first field map of the magnetic field $B_0$ is measured while each of the shim tray slots 902 is empty. A first set of shim tray slots 902 to populate with the shim magnets 914 is determined 1604 by applying the first field map to a genetic algorithm. The first set of shim tray slots 902 is populated 1606 with the shim magnets 914. A second field map of the magnetic field $B_0$ is measured 1608 after the first set of shim tray slots 902 is populated with the shim magnets 914. A second set of shim tray slots 902 to populate with the shim magnets 914 is determined 1610 by applying the second field map to the genetic algorithm. The second set of shim tray slots 902 is then populated with shim magnets 914.

According to one aspect, the method 1600 further comprises determining a set of unpopulated shim tray slots 902. For example, the set of unpopulated shim tray slots 902 can be the remaining shim tray slots 902 that are not in the first set of shim tray slots 902. Further, determining 1610 the second set of shim tray slots 902 to populate with the shim magnets 914 by applying the second field map to the genetic algorithm can include constraining the genetic algorithm to consider only the unpopulated shim tray slots 902 for inclusion in the second set of shim tray slots 902.

According to one aspect of the method 1600, determining 1604 the first set of shim tray slots 902 to populate with the shim magnets by applying the first field map to the genetic algorithm can include determining, for each of the first set of shim tray slots 902, a configuration for installing the corresponding shim magnet. The configuration may be selected from a set of possible configurations. In some aspects, the set of possible configurations includes a first configuration and a second configuration. For example, when in the first configuration, the corresponding shim magnet 914 can generate a magnetic field that is in alignment with the direction of the main magnetic field $B_0$ in the region of interest. When in the second configuration, the corresponding shim magnet 914 can generate a magnetic field that is in reverse to the direction of the main magnetic field $B_0$ in the region of interest. As another example, when in the first configuration, a pole of the corresponding shim magnet 914 can be facing a first direction. When in the second configuration, the pole of the corresponding shim magnet 914 can be facing a second direction that is opposite the first direction. In other aspects, the set of possible configurations includes eight different configurations. For example, the shim magnets 914 may be eight sided. In one aspect, each of the eight different configurations can correspond to a different side of the shim magnet 914 facing toward the base of the shim tray slot 902 when installed. In another aspect, each of the eight different configurations can correspond to the pole of the shim magnet 914 being oriented differently relative to the main magnetic field $B_0$ in the region of interest when installed in the shim tray slot 902.

According to one aspect of the method 1600, determining 1604 the first set of shim tray slots 902 to populate with the shim magnets 914 by applying the first field map to the genetic algorithm can include determining, for each of the first set of shim tray slots 902, a strength of the corresponding one of the shim magnets 914 for populating the shim tray slot 902. For example, determining, for each of the first set of shim tray slots 902, the strength of the corresponding one of the shim magnets 914 for populating the shim tray slot can include determining whether to populate the shim tray slot 902 with either a first shim magnet having a first strength (e.g., an N42 magnet) or a second shim magnet having a second strength (e.g., an N52 magnet).

According to one aspect of the method 1600, populating 1606 the first set of shim tray slots 902 with the shim magnets 914 can include populating the first set of shim tray slots 902 with first shim magnets each having a first strength. According to another aspect of the method 1600, populating 1612 the second set of shim tray slots 902 with the shim magnets 914 comprises populating the second set of shim tray slots 902 with second shim magnets having a second strength. For example, the second strength can be weaker than the first strength. As another example, the first strength can be weaker than the second strength.

Examples

The inventors of the present disclosure have implemented the methods 1400, 1600 to passively shim an LF-MRI system, as explained below in the following examples.

Two low-field (~70 mT), head-optimized, permanent magnet MRI systems (Example System #1 and Example System #2) were tested using an iterative shimming strategy. For Example System #1 and Example System #2, the main magnetic field $B_0$ field was measured at 3 stages: pre-shim, $1^{st}$ stage, and $2^{nd}$ stage. For field homogeneity evaluation, a brain-shaped region of interest (ROI) was used. For both Example System #1 and Example System #2, after a two-stage shimming process, both the simulated field map and the measured field map indicated improved $B_0$ field homogeneity compared to the simulated field map and the measured field map generated after a single stage of shimming.

Figure 17B:
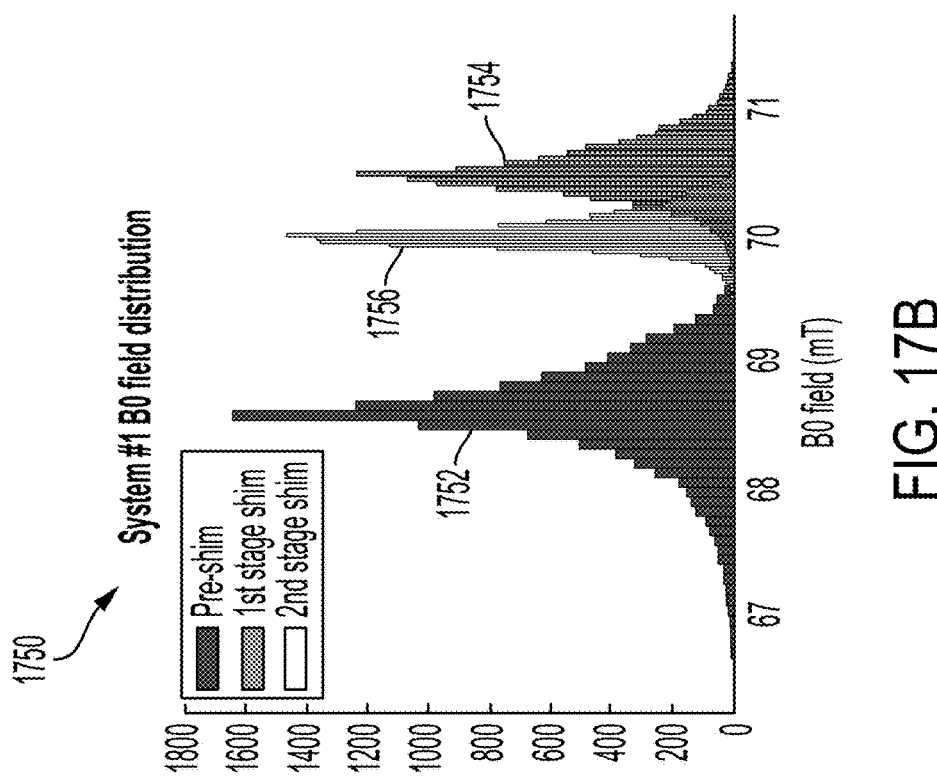
FIG. 17B depicts a histogram of the main magnetic field strength distribution for the example MRI system of FIG. 17A measured pre-shim, after the first stage of shimming, and after the second stage of shimming, in accordance with at least one aspect of the present disclosure.
Figure 17A:
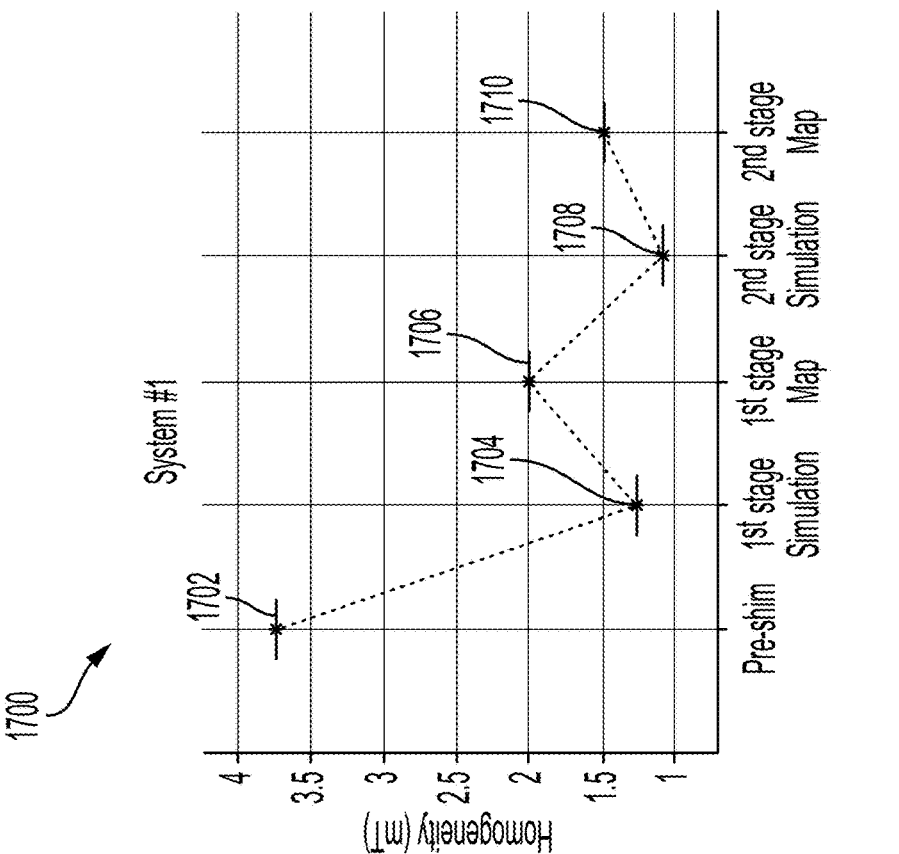
FIG. 17A depicts a graph showing both simulated and measured main magnetic field $B_0$ homogeneity throughout a two-stage passive shimming process for an example MRI system, in accordance with at least one aspect of the present disclosure.

For example, FIG. 17A depicts a graph 1700 showing both simulated and measured main magnetic field $B_0$ homogeneity through a two-stage passive shimming process for the Example System #1. That is, the graph 1700 shows a measured pre-shim homogeneity 1702, a simulated first stage homogeneity 1704 (the homogeneity of the simulated main magnetic field $B_0$ with a first set of the shim tray slots populated with magnets), a measured first stage homogeneity 1706 (the homogeneity of the actually-measured main magnetic field $B_0$ with the first set of the shim tray slots populated with magnets), a simulated second stage homogeneity 1708 (the homogeneity of the simulated main magnetic field $B_0$ with the first set and a second set of the shim tray slots populated with magnets), a measured second stage homogeneity 1710 (the homogeneity of the actually-measured main magnetic field $B_0$ with the first set and the second set of the shim tray slots populated with magnets). A 31.0% improvement in field homogeneity was observed from the measured first stage homogeneity 1706 to the measured second stage homogeneity 1710. Thus, a significant improvement in field homogeneity was observed in Example System #1 by performing a second iteration of passive shimming.

Figure 18B:
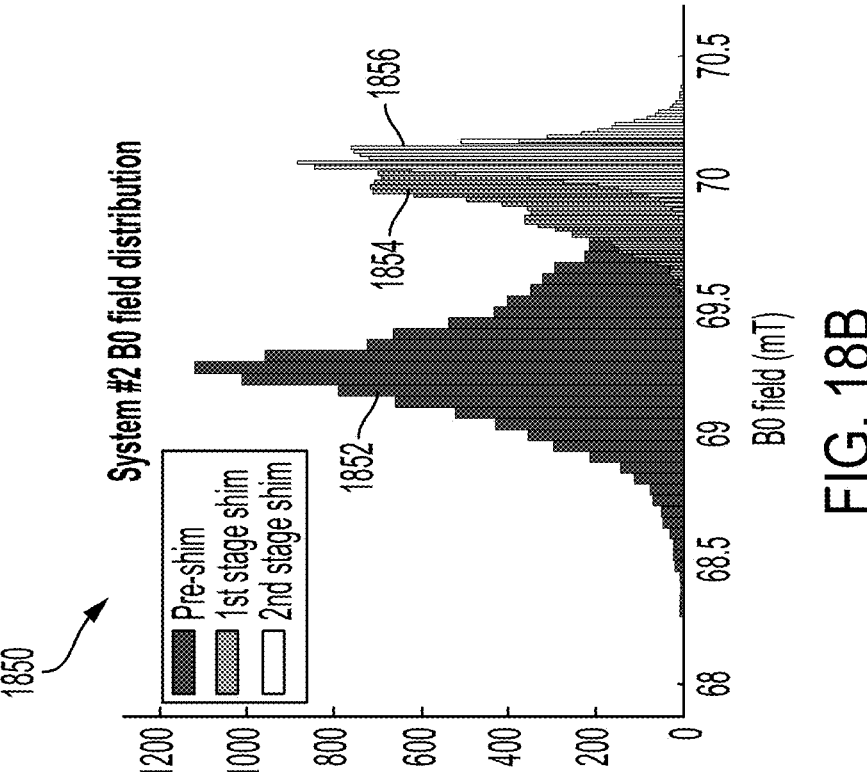
FIG. 18B depicts a histogram of the main magnetic field strength distribution for the example MRI system of FIG. 18A measured pre-shim, after the first stage of shimming, and after the second stage of shimming, in accordance with at least one aspect of the present disclosure.
Figure 18A:
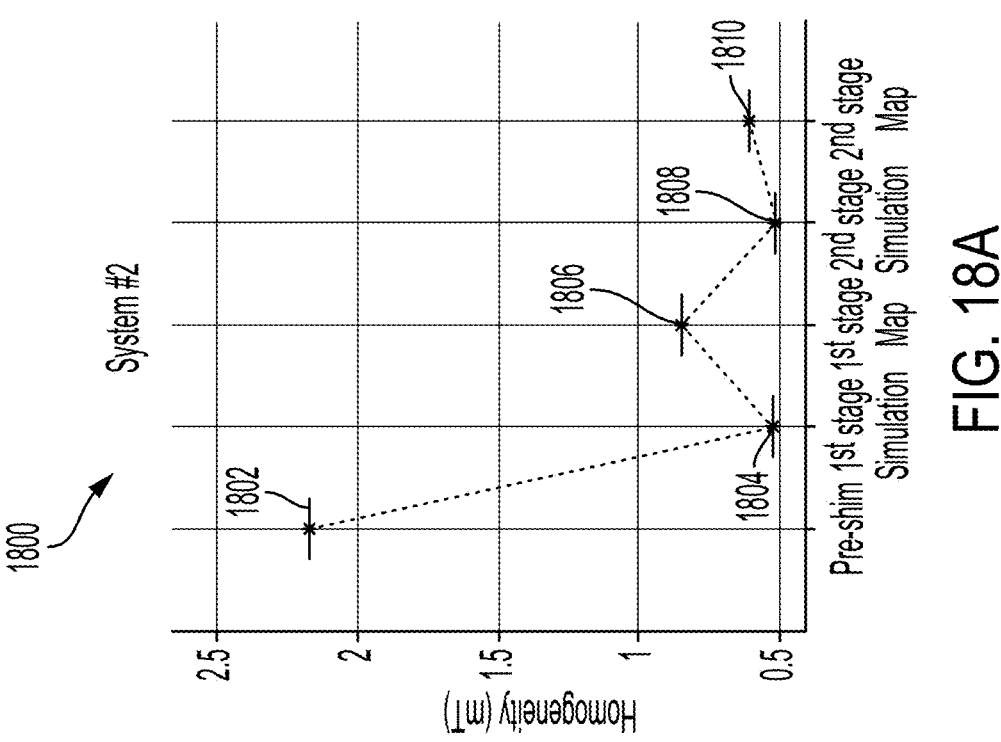
FIG. 18A depicts a graph showing both simulated and measured main magnetic field $B_0$ homogeneity throughout a two-stage passive shimming process for another example MRI system, in accordance with at least one aspect of the present disclosure.

Similarly, FIG. 18A depicts a graph 1800 showing both simulated and measured main magnetic field $B_0$ homogeneity through a two-stage passive shimming process for the Example System #2. That is, the graph 1800 shows a measured pre-shim homogeneity 1802, a simulated first stage homogeneity 1804 (the homogeneity of the simulated main magnetic field $B_0$ with a first set of the shim tray slots populated with magnets), a measured first stage homogeneity 1806 (the homogeneity of the actually-measured main magnetic field $B_0$ with the first set of the shim tray slots populated with magnets), a simulated second stage homogeneity 1808 (the homogeneity of the simulated main magnetic field $B_0$ with the first set and a second set of the shim tray slots populated with magnets), a measured second stage homogeneity 1810 (the homogeneity of the actually-measured main magnetic field $B_0$ with the first set and the second set of the shim tray slots populated with magnets). A 30.0% improvement in field homogeneity was observed from the measured first stage homogeneity 1806 to the measured second stage homogeneity 1810, with the measured second stage homogeneity 1810 being 8,592 ppm at 70.0 mT mean field strength. Again, a significant improvement in field homogeneity was observed in Example System #2 by performing a second iteration of passive shimming.

In both Example System #1 and Example System #1, during the first stage shimming, for each of the shim tray slots, the genetic algorithm considered either not populating the shim tray slot (value=0) or populating the shim tray slot with a magnet oriented to generate a field that is aligned with the main magnetic field (value=1). In Example System #2, during the second stage shimming, for each of the available shim tray slots, the genetic algorithm again considered either not populating the shim tray slot (value=0) or populating the shim tray slot with a magnet oriented to generate a field that is aligned with the main magnetic field (value=1). However, in Example System #1, during the second stage shimming, for each of the available shim tray slots, the genetic algorithm considered not populating the shim tray slot (value=0), populating the shim tray slot with a magnet oriented to generate a field that is aligned with the direction of the main magnetic field (value=1), or populating the shim tray slot with a magnet oriented to generate a field that is reverse to the direction of the main magnetic field (value=2).

Because some of shim tray slots of Example System #1 were populated with magnets oriented to generate a field that is reverse to the direction of the main magnetic field during the second stage of shimming, a decrease in main magnetic field strength was observed from the first stage of shimming to the second stage of shimming. For example, FIG. 17B shows a histogram 1750 of the measured main magnetic field strength distribution for Example System #1 pre-shim 1752, after the first stage of shimming 1754, and after the second stage of shimming 1765. The field strength after first stage of shimming 1754 is greater than the field strength after second stage of shimming 1756. Similarly, FIG. 18B shows a histogram 1850 of the measured main magnetic field strength distribution for Example System #2 pre-shim 1852, after the first stage of shimming 1854, and after the second stage of shimming 1865. Unlike System #1, in System #2, the field strength after first stage of shimming 1854 is less than the field strength after second stage of shimming 1856.

Clauses

Various additional aspects of the subject matter described herein are set out in the following numbered clauses:

Clause 1: A method, comprising: generating a first field map of a magnetic field $B_0$ from a magnetic resonance imaging (MRI) system, wherein the MRI system comprises: an array of permanent magnets in a modified Halbach dome arrangement, wherein the array comprises one open end sized to receive a head of a patient, and wherein the array is configured to generate the magnetic field $B_0$; and a shim tray comprising slots configured to receive shim magnets; wherein the first field map corresponds to a magnetic field based on each of the slots being empty; applying the first field map to a genetic algorithm to determine a first set of slots to receive a first set of shim magnets; installing the first set of shim magnets in the first set of slots; generating a second field map of the magnetic field $B_0$, wherein the second field map corresponds to a magnetic field based on the first set of shim magnets being installed in the first set of slots; applying the second field map to the genetic algorithm to determine a second set of slots to receive a second set of shim magnets, wherein the second set of slots is different than the first set of slots; and installing the second set of shim magnets in the second set of slots.

Clause 2: The method of Clause 1, wherein a size of the first set of shim magnets is the same as a size of the second set of shim magnets.

Clause 3: The method of Clause 1, wherein a size of the first set of shim magnets is different from a size of the second set of shim magnets.

Clause 4: The method of any of Clauses 1-3, further comprising: determining a set of empty slots in the shim tray, wherein the set of empty slots consists of the slots excluded from the first set of slots; and constraining the genetic algorithm to consider only the set of empty slots for inclusion in the second set of slots.

Clause 5: The method of any of Clauses 1-4, wherein applying the first field map to the genetic algorithm to determine the first set of slots to receive the first set of shim magnets further comprises determining, for each of the first set of slots, a configuration for installing the corresponding one of the shim magnets in the slot, wherein the configuration is selected from a set of possible configurations, and wherein the set of possible configurations comprises a first configuration and a second configuration.

Clause 6: The method of Clause 5, wherein, in the first configuration, the corresponding shim magnet generates a first magnetic field that is substantially aligned with a direction of the magnetic field $B_0$, and wherein, in the second configuration, the corresponding shim magnet generates a second magnetic field that is substantially reverse to the direction of the magnetic field $B_0$.

Clause 7: The method of any of Clauses 5-6, wherein the set of possible configurations further comprises a second configuration, a third configuration, a fourth configuration, a fifth configuration, a sixth configuration, a seventh configuration, and an eight configuration.

Clause 8: The method of any of Clauses 5-7, wherein, in the first configuration, a pole of the shim magnet is oriented in a first direction, and wherein, in the second configuration, the pole of the shim magnet is oriented in a second direction that is opposite the first direction.

Clause 9: The method of any of Clauses 5-8, wherein applying the second field map to the genetic algorithm to determine the second set of slots to receive the second set of shim magnets further comprises determining, for each of the second set of slots, a configuration for installing the corresponding one of the shim magnets in the slot, wherein the configuration is selected from the set of possible configurations.

Clause 10: The method of any of Clauses 1-9, wherein each of the slots is configured to receive at least an end portion of a shim magnet, and wherein each of the slots is configured to receive the same size end portion.

Clause 11: The method of any of Clauses 1-10, wherein applying the first field map to the genetic algorithm to determine the first set of slots to receive the first set of shim magnets comprises determining, for each of the first set of slots, a strength of the corresponding one of the shim magnets.

Clause 12: The method of Clause 11, wherein determining, for each of the first set of shim tray slots, the strength of the corresponding one of the shim magnets comprises determining whether to install either a first shim magnet having a first strength or a second shim magnet having a second strength.

Clause 13: The method of Clause 12, wherein the first shim magnet having the first strength comprises an N42 magnet, and wherein the second shim magnet having the second strength comprises an N52 magnet.

Clause 14: The method of any of Clauses 1-11, further comprising installing the first set of shim magnets in the first set of slots comprises installing first shim magnets each having a first strength; and wherein installing the second set of shim magnets in the second set of slots comprises installing second shim magnets having a second strength, wherein the second strength is weaker than the first strength.

Clause 15: A system for magnetic resonance imaging (MRI), comprising: an array of permanent magnets in a modified Halbach arrangement forming one open end, wherein the open end is sized to receive a head of a patient, wherein the array of permanent magnets is configured to generate a low-field strength magnetic field $B_0$ toward an object of interest located within a field of view; and a shim tray positionable within the array of permanent magnets, wherein the shim tray comprises an array of shim tray slots, wherein the shim tray comprises an opening sized to receive the head of the patient, and wherein each of the shim tray slots is configured to receive a shim magnet in a first configuration and a second configuration, wherein, in the first configuration, a polarity of the shim magnet is oriented in a first direction, and wherein, in the second configuration, the polarity of the shim magnet is oriented in a second direction that is opposite the first direction.

Clause 16: The system of Claim 15, wherein the array of permanent magnets comprise primary permanent magnets, wherein the system further comprises a plurality of shim magnets installed in a portion of the shim tray slots, wherein the plurality of shim magnets comprise secondary permanent magnets positioned relative to the primary permanent magnets to increase a homogeneity of the magnetic field $B_0$ generated by the permanent magnets.

Clause 17: The system of Claim 16, wherein each of the shim tray slots is configured to receive at least an end portion of a shim magnet, and wherein each of the shim tray slots is configured to receive the same size end portion.

Clause 18: The system of Claim 17, wherein the plurality of shim magnets comprises: a first shim magnet defining a first magnetic field strength; and a second shim magnet defining a second magnetic field strength.

Clause 19: The system of Claim 16, wherein at least one of the plurality of shim magnets is installed in the second configuration.

Clause 20: The system of Claim 16, wherein the plurality of shim magnets are installed in less than all of the shim tray slots.

Clause 21: A method, comprising: generating a field map of a magnetic field $B_0$ from a magnetic resonance imaging (MRI) system, wherein the MRI system comprises: an array of permanent magnets in a modified Halbach dome arrangement, wherein the array comprises one open end sized to receive a head of a patient, and wherein the array is configured to generate the magnetic field $B_0$; and a shim tray comprising slots configured to receive shim magnets; and shimming the MRI system by iteratively: applying the field map to a genetic algorithm to determine a set of slots to receive a set of shim magnets; installing the set of shim magnets in the set of slots; generating a next field map of the magnetic field $B_0$, wherein the next field map corresponds to a magnetic field based on the set of shim magnets being installed in the set of slots; and either performing a next iteration based on the next field map or determining to not perform the next iteration based on the next field map.

While several forms have been illustrated and described, it is not the intention of Applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, and/or examples can be implemented, individually and/or collectively, by a wide range of hardware, software, firmware, or virtually any combination thereof. Those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as one or more program products in a variety of forms, and that an illustrative form of the subject matter described herein applies regardless of the particular type of signal bearing medium used to actually carry out the distribution.

Instructions used to program logic to perform various disclosed aspects can be stored within a memory in the system, such as dynamic random access memory (DRAM), cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, compact disc, read-only memory (CD-ROMs), and magneto-optical disks, read-only memory (ROMs), random access memory (RAM), erasable programmable read-only memory (EPROM), electrically erasable programmable read-only memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the non-transitory computer-readable medium includes any type of tangible machine-readable medium suitable for storing or transmitting electronic instructions or information in a form readable by a machine (e.g., a computer).

As used in any aspect herein, the term "control circuit" may refer to, for example, hardwired circuitry, programmable circuitry (e.g., a computer processor including one or more individual instruction processing cores, processing unit, processor, microcontroller, microcontroller unit, controller, digital signal processor (DSP), programmable logic device (PLD), programmable logic array (PLA), or field programmable gate array (FPGA)), state machine circuitry, firmware that stores instructions executed by programmable circuitry, and any combination thereof. The control circuit may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Accordingly, as used herein "control circuit" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

As used in any aspect herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

As used in any aspect herein, the terms "component," "system," "module" and the like can refer to a control circuit computer-related entity, either hardware, a combination of hardware and software, software, or software in execution.

As used in any aspect herein, an "algorithm" refers to a self-consistent sequence of steps leading to a desired result, where a "step" refers to a manipulation of physical quantities and/or logic states which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities and/or states.

A network may include a packet switched network. The communication devices may be capable of communicating with each other using a selected packet switched network communications protocol. One example communications protocol may include an Ethernet communications protocol which may be capable permitting communication using a Transmission Control Protocol/Internet Protocol (TCP/IP). The Ethernet protocol may comply or be compatible with the Ethernet standard published by the Institute of Electrical and Electronics Engineers (IEEE) titled "IEEE 802.3 Standard", published in December, 2008 and/or later versions of this standard. Alternatively or additionally, the communication devices may be capable of communicating with each other using an X.25 communications protocol. The X.25 communications protocol may comply or be compatible with a standard promulgated by the International Telecommunication Union-Telecommunication Standardization Sector (ITU-T). Alternatively or additionally, the communication devices may be capable of communicating with each other using a frame relay communications protocol. The frame relay communications protocol may comply or be compatible with a standard promulgated by Consultative Committee for International Telegraph and Telephone (CCITT) and/or the American National Standards Institute (ANSI). Alternatively or additionally, the transceivers may be capable of communicating with each other using an Asynchronous Transfer Mode (ATM) communications protocol. The ATM communications protocol may comply or be compatible with an ATM standard published by the ATM Forum titled "ATM-MPLS Network Interworking 2.0" published August 2001, and/or later versions of this standard. Of course, different and/or after-developed connection-oriented network communication protocols are equally contemplated herein.

Unless specifically stated otherwise as apparent from the foregoing disclosure, it is appreciated that, throughout the foregoing disclosure, discussions using terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

One or more components may be referred to herein as "configured to," "configurable to," "operable/operative to," "adapted/adaptable," "able to," "conformable/conformed to," etc.

Those skilled in the art will recognize that "configured to" can generally encompass active-state components and/or inactive-state components and/or standby-state components, unless context requires otherwise.

The terms "proximal" and "distal" are used herein with reference to a clinician manipulating the handle portion of the surgical instrument. The term "proximal" refers to the portion closest to the clinician and the term "distal" refers to the portion located away from the clinician. It will be further appreciated that, for convenience and clarity, spatial terms such as "vertical", "horizontal", "up", and "down" may be used herein with respect to the drawings. However, surgical instruments are used in many orientations and positions, and these terms are not intended to be limiting and/or absolute.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flow diagrams are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect. Furthermore, the particular features, structures or characteristics may be combined in any suitable manner in one or more aspects.

Any patent application, patent, non-patent publication, or other disclosure material referred to in this specification and/or listed in any Application Data Sheet is incorporated by reference herein, to the extent that the incorporated materials is not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

What is claimed is:
1. A method, comprising:
  generating a first field map of a magnetic field Bo from a magnetic resonance imaging (MRI) system, wherein the MRI system comprises:
    an array of permanent magnets in a modified Halbach dome arrangement, wherein the array comprises one open end sized to receive a head of a patient, and wherein the array is configured to generate the magnetic field $B_0$; and
    a shim tray comprising slots configured to receive shim magnets;
    wherein the first field map corresponds to a magnetic field based on each of the slots being empty;
  applying the first field map to a genetic algorithm to determine a first set of slots to receive a first set of shim magnets;
  installing the first set of shim magnets in the first set of slots;
  generating a second field map of the magnetic field $B_0$, wherein the second field map corresponds to a magnetic field based on the first set of shim magnets being installed in the first set of slots;
  applying the second field map to the genetic algorithm to determine a second set of slots to receive a second set of shim magnets, wherein the second set of slots is different than the first set of slots; and installing the second set of shim magnets in the second set of slots.

2. The method of claim 1, wherein a size of the first set of shim magnets is the same as a size of the second set of shim magnets.

3. The method of claim 1, wherein a size of the first set of shim magnets is different from a size of the second set of shim magnets.

4. The method of claim 1, further comprising:

determining a set of empty slots in the shim tray, wherein the set of empty slots consists of the slots excluded from the first set of slots; and constraining the genetic algorithm to consider only the set of empty slots for inclusion in the second set of slots.

5. The method of claim 1, wherein applying the first field map to the genetic algorithm to determine the first set of slots to receive the first set of shim magnets further comprises determining, for each of the first set of slots, a configuration for installing the corresponding one of the shim magnets in the slot, wherein the configuration is selected from a set of possible configurations, and wherein the set of possible configurations comprises a first configuration and a second configuration.

6. The method of claim 5, wherein, in the first configuration, the corresponding shim magnet generates a first magnetic field that is substantially aligned with a direction of the magnetic field $B_0$, and wherein, in the second configuration, the corresponding shim magnet generates a second magnetic field that is substantially reverse to the direction of the magnetic field $B_0$.

7. The method of claim 6, wherein the set of possible configurations further comprises a second configuration, a third configuration, a fourth configuration, a fifth configuration, a sixth configuration, a seventh configuration, and an eight configuration.

8. The method of claim 5, wherein, in the first configuration, a pole of the shim magnet is oriented in a first direction, and wherein, in the second configuration, the pole of the shim magnet is oriented in a second direction that is opposite the first direction.

9. The method of claim 5, wherein applying the second field map to the genetic algorithm to determine the second set of slots to receive the second set of shim magnets further comprises determining, for each of the second set of slots, a configuration for installing the corresponding one of the shim magnets in the slot, wherein the configuration is selected from the set of possible configurations.

10. The method of claim 1, wherein each of the slots is configured to receive at least an end portion of a shim magnet, and wherein each of the slots is configured to receive the same size end portion.

11. The method of claim 1, wherein applying the first field map to the genetic algorithm to determine the first set of slots to receive the first set of shim magnets comprises determining, for each of the first set of slots, a strength of the corresponding one of the shim magnets.

12. The method of claim 11, wherein determining, for each of the first set of shim tray slots, the strength of the corresponding one of the shim magnets comprises determining whether to install either a first shim magnet having a first strength or a second shim magnet having a second strength.

13. The method of claim 12, wherein the first shim magnet having the first strength comprises an N42 magnet, and wherein the second shim magnet having the second strength comprises an N52 magnet.

14. The method of claim 1, further comprising installing the first set of shim magnets in the first set of slots comprises installing first shim magnets each having a first strength; and wherein installing the second set of shim magnets in the second set of slots comprises installing second shim magnets having a second strength, wherein the second strength is weaker than the first strength.

15. A system for magnetic resonance imaging (MRI), comprising:

an array of permanent magnets in a modified Halbach arrangement forming one open end, wherein the open end is sized to receive a head of a patient, wherein the array of permanent magnets is configured to generate a low-field strength magnetic field $B_0$ toward an object of interest located within a field of view; and a shim tray positionable within the array of permanent magnets, wherein the shim tray comprises an array of shim tray slots, wherein the shim tray comprises an opening sized to receive the head of the patient, and wherein each of the shim tray slots is configured to receive a shim magnet in a first configuration and a second configuration, wherein, in the first configuration, a polarity of the shim magnet is oriented in a first direction, and wherein, in the second configuration, the polarity of the shim magnet is oriented in a second direction that is opposite the first direction.

16. The system of claim 15, wherein the array of permanent magnets comprise primary permanent magnets, wherein the system further comprises a plurality of shim magnets installed in a portion of the shim tray slots, wherein the plurality of shim magnets comprise secondary permanent magnets positioned relative to the primary permanent magnets to increase a homogeneity of the magnetic field $B_0$ generated by the permanent magnets.

17. The system of claim 16, wherein each of the shim tray slots is configured to receive at least an end portion of a shim magnet, and wherein each of the shim tray slots is configured to receive the same size end portion.

18. The system of claim 17, wherein the plurality of shim magnets comprises:

a first shim magnet defining a first magnetic field strength; and a second shim magnet defining a second magnetic field strength.

19. The system of claim 16, wherein at least one of the plurality of shim magnets is installed in the second configuration.

20. The system of claim 16, wherein the plurality of shim magnets are installed in less than all of the shim tray slots.

* * * * *